(12) United States Patent
Itasaka et al.

(10) Patent No.: US 12,388,400 B2
(45) Date of Patent: Aug. 12, 2025

(54) CIRCUIT DEVICE AND OSCILLATOR

(71) Applicant: SEIKO EPSON CORPORATION, Tokyo (JP)

(72) Inventors: Yosuke Itasaka, Minowa (JP); Takashi Nomiya, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 18/613,447

(22) Filed: Mar. 22, 2024

(65) Prior Publication Data
US 2024/0421767 A1   Dec. 19, 2024

(30) Foreign Application Priority Data

Mar. 24, 2023   (JP) ................................ 2023-047697

(51) Int. Cl.
*H03B 5/04* (2006.01)
*H03B 5/36* (2006.01)
*H03L 1/02* (2006.01)

(52) U.S. Cl.
CPC ................. *H03B 5/04* (2013.01); *H03B 5/36* (2013.01); *H03L 1/022* (2013.01); *H03L 1/028* (2013.01);
(Continued)

(58) Field of Classification Search
CPC ... H03B 5/04; H03B 5/30; H03B 5/32; H03B 5/36; H03B 5/362; H03B 5/364;
(Continued)

(56) References Cited

U.S. PATENT DOCUMENTS 5,883,550 A * 3/1999 Watanabe ............... H03L 1/023
                                                  331/177 V
2003/0064694 A1   4/2003 Oka
(Continued)

FOREIGN PATENT DOCUMENTS

JP    2011-504306 A    2/2011
JP    2014-030141 A    2/2014
(Continued)

*Primary Examiner* — Levi Gannon
(74) *Attorney, Agent, or Firm* — Harness, Dickey & Pierce, P.L.C.

(57) ABSTRACT

A circuit device is configured to switching between a first mode in which phase noise of an output clock signal is low and a second mode in which power consumption is small, and includes an oscillation circuit configured to generate an oscillation signal, an output circuit configured to output the output clock signal, a temperature sensor configured to output a temperature detection signal, a temperature compensation circuit configured to perform temperature compensation on an oscillation frequency based on the temperature detection signal, and a control circuit. The control circuit performs control such that a power supply voltage supplied to the oscillation circuit in the first mode is higher than a power supply voltage supplied to the oscillation circuit in the second mode. In addition, the control circuit performs control such that at least one of a reference voltage supplied to the temperature compensation circuit and a reference current supplied to the temperature sensor does not change between the first mode and the second mode.

9 Claims, 15 Drawing Sheets

(52) U.S. Cl.
CPC ............... *H03B 2200/0082* (2013.01); *H03B 2200/009* (2013.01)

(58) Field of Classification Search
CPC ................... H03B 5/366; H03B 5/368; H03B 2200/0082; H03B 2200/0088; H03B 2200/009; H03L 1/02; H03L 1/022; H03L 1/023; H03L 1/025; H03L 1/026; H03L 1/028
See application file for complete search history.

(56) References Cited

U.S. PATENT DOCUMENTS

| | | | |
|---|---|---|---|
| 2009/0088194 A1 | 4/2009 | Petty, Jr. et al. | |
| 2014/0035689 A1 | 2/2014 | Ozawa et al. | |
| 2017/0141727 A1* | 5/2017 | Fukuzawa | H03L 1/023 |
| 2018/0183442 A1* | 6/2018 | Pavao Moreira | H03B 5/1265 |
| 2020/0313619 A1* | 10/2020 | Sawada | H03B 5/04 |

FOREIGN PATENT DOCUMENTS

| | | |
|---|---|---|
| JP | 2015-041921 A | 3/2015 |
| WO | 2003/021765 A1 | 3/2003 |

\* cited by examiner

FIG. 10
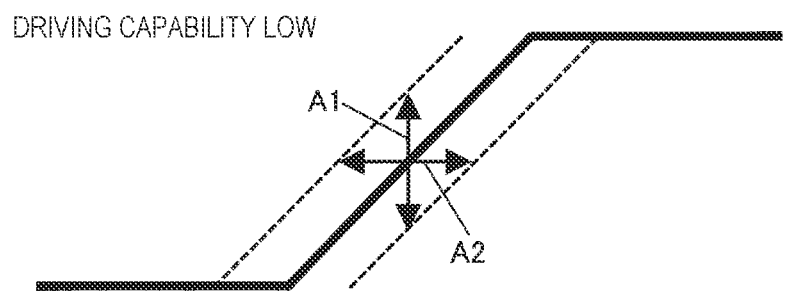
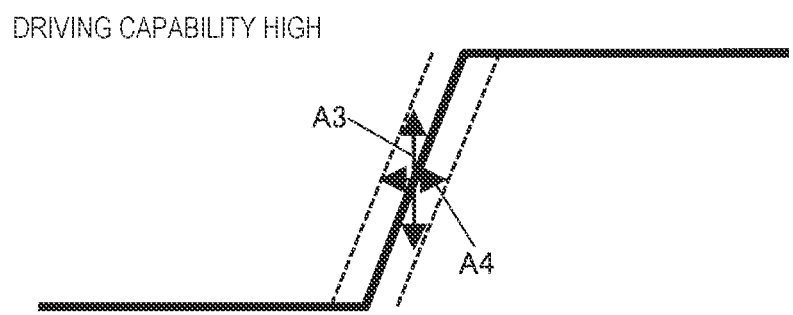

# CIRCUIT DEVICE AND OSCILLATOR

The present application is based on, and claims priority from JP Application Serial Number 2023-047697, filed Mar. 24, 2023, the disclosure of which is hereby incorporated by reference herein in its entirety.

BACKGROUND

1. Technical Field

The present disclosure relates to a circuit device, an oscillator, and the like.

2. Related Art

WO 03/021765 discloses an oscillator capable of implementing a TCXO mode, a VCXO mode, an SPXO mode, or the like with one IC by selectively supplying a temperature compensation voltage from a temperature compensation circuit, a frequency adjustment voltage from a frequency adjustment circuit, or the like to a voltage control circuit.

WO 03/021765 is an example of the related art.

WO 03/021765 discloses switching of an operation mode, but does not consider switching of a power supply voltage according to a mode or an influence thereof. Further, switching between a plurality of modes with different power consumption is not disclosed. For example, in the related art of WO 03/021765, when these modes added, there is a possibility that accuracy of temperature compensation is decreased due to a change in the power supply voltage.

SUMMARY

An aspect of the present disclosure relates to a circuit device configured to switching between a first mode in which phase noise of an output clock signal is lower than that in a second mode and the second mode in which power consumption is smaller than that in the first mode, and the circuit device includes: an oscillation circuit configured to generate an oscillation signal; an output circuit configured to output the output clock signal based on the oscillation signal; a temperature sensor configured to output a temperature detection signal; a temperature compensation circuit configured to perform temperature compensation on an oscillation frequency of the oscillation circuit based on the temperature detection signal; and a control circuit configured to perform control such that a power supply voltage supplied to the oscillation circuit in the first mode is higher than a power supply voltage supplied to the oscillation circuit in the second mode, and perform control such that at least one of a reference voltage supplied to the temperature compensation circuit based on the power supply voltage and a reference current supplied to the temperature sensor based on the power supply voltage does not change between the first mode and the second mode.

Another aspect of the present disclosure relates to an oscillator configured to switching between a first mode in which phase noise of an output clock signal is lower than that in a second mode and the second mode in which power consumption is smaller than that in the first mode, and the oscillator includes: a resonator; and a circuit device. The circuit device includes an oscillation circuit configured to oscillate the resonator to generate an oscillation signal; an output circuit configured to output the output clock signal based on the oscillation signal; a temperature sensor configured to output a temperature detection signal; a temperature compensation circuit configured to perform temperature compensation on an oscillation frequency of the oscillation circuit based on the temperature detection signal; and a control circuit configured to perform control such that a power supply voltage supplied to the oscillation circuit in the first mode is higher than a power supply voltage supplied to the oscillation circuit in the second mode, and perform control such that at least one of a reference voltage supplied to the temperature compensation circuit based on the power supply voltage and a reference current supplied to the temperature sensor based on the power supply voltage does not change between the first mode and the second mode.

BRIEF DESCRIPTION OF THE DRAWINGS

FIG. 10 shows a relationship between a driving capability of the waveform shaping circuit and phase noise.

DESCRIPTION OF EMBODIMENTS

Hereinafter, an embodiment will be described. The embodiment to be described below does not unduly limit the scope of the claims. Further, all of the components described in the embodiment are not necessarily essential components.

1. Circuit Device and Oscillator

Figure 1:
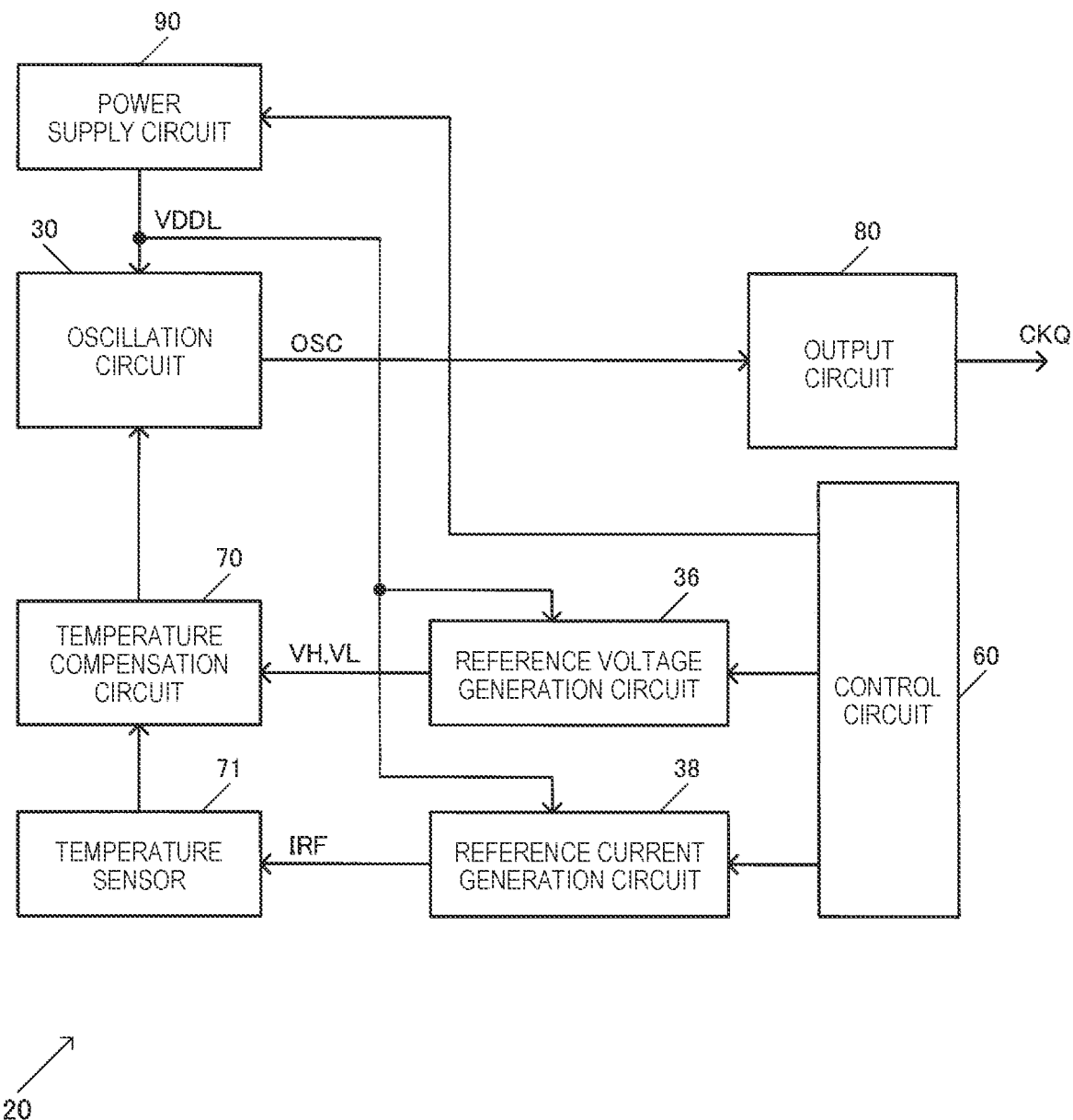
FIG. 1 shows a configuration example of a circuit device according to the embodiment.

FIG. 1 shows a configuration example of a circuit device 20 according to the embodiment. The circuit device 20 according to the embodiment includes an oscillation circuit 30, an output circuit 80, a temperature compensation circuit 70, a temperature sensor 71, and a control circuit 60. The circuit device 20 may further include a reference voltage generation circuit 36, a reference current generation circuit 38, and a power supply circuit 90.

The oscillation circuit 30 generates an oscillation signal OSC. For example, the oscillation circuit 30 generates the oscillation signal OSC by oscillating a resonator or the like. Alternatively, the oscillation circuit 30 may generate the oscillation signal OSC by an LC resonance circuit or the like. The oscillation signal OSC is, for example, a sine wave signal. The oscillation circuit 30 includes a drive circuit or the like for generating the oscillation signal OSC by driving the resonator or the like.

The output circuit 80 outputs an output clock signal CKQ. For example, the output circuit 80 outputs the output clock signal CKQ based on the oscillation signal OSC. For example, the output circuit 80 buffers a clock signal based on the oscillation signal OSC to output the output clock signal CKQ. The clock signal based on the oscillation signal OSC is, for example, a rectangular wave clock signal obtained by a waveform shaping circuit (not shown) performing waveform shaping on the oscillation signal OSC. Alternatively, the output circuit 80 may output a signal obtained by dividing or multiplying a frequency of the clock signal based on the oscillation signal OSC as the output clock signal CKQ. For example, a frequency division circuit, a PLL circuit, or the like, which will be described later, may be provided between the oscillation circuit 30 and the output circuit 80, and the output circuit 80 may output the output clock signal CKQ obtained by the frequency division circuit dividing the frequency of the clock signal or the PLL circuit multiplying the frequency of the clock signal.

The temperature compensation circuit 70 performs temperature compensation on an oscillation frequency of the oscillation circuit 30. The temperature compensation is a process of preventing and compensating a fluctuation of the oscillation frequency due to a temperature fluctuation. For example, the temperature compensation is a process of compensating frequency-temperature characteristics of the oscillation signal OSC. Specifically, the temperature compensation circuit 70 performs the temperature compensation based on a temperature detection signal from the temperature sensor 71. For example, the temperature compensation circuit 70 generates a temperature compensation voltage based on a temperature detection voltage from the temperature sensor 71, and outputs the generated temperature compensation voltage to a variable capacitance circuit provided in the oscillation circuit 30, thereby performing the temperature compensation. In this case, the variable capacitance circuit of the oscillation circuit 30 is implemented by a variable capacitance element such as a varactor. For example, when the temperature compensation voltage for compensating frequency-temperature characteristics of a resonator 10 is approximated by a polynomial, the temperature compensation circuit 70 performs the temperature compensation in an analog manner based on coefficient information on the polynomial. Alternatively, the temperature compensation circuit 70 may perform the temperature compensation in a digital manner. In this case, the variable capacitance circuit can be implemented by, for example, a capacitor array and a switch array coupled to the capacitor array, and the temperature compensation circuit 70 can be implemented by, for example, a logic circuit.

The temperature sensor 71 is a sensor that detects a temperature. Specifically, the temperature sensor 71 outputs, as the temperature detection voltage, a temperature-dependent voltage that changes according to a temperature of an environment. Specifically, the temperature sensor 71 outputs the temperature detection voltage whose voltage changes depending on the temperature using, for example, temperature dependence of a forward voltage of a PN junction. A modification using a temperature sensor circuit in the digital manner as the temperature sensor 71 can also be adopted. In this case, temperature detection data may be subjected to D/A conversion to generate the temperature detection voltage. The temperature compensation circuit 70 and the temperature sensor 71 may not be provided.

The reference voltage generation circuit 36 generates a reference voltage. For example, the reference voltage generation circuit 36 generates reference voltages VH and VL based on a power supply voltage VDDL, and supplies the reference voltages VH and VL to the temperature compensation circuit 70. The reference voltage VH is a reference voltage for temperature compensation in, for example, a temperature range of a high temperature side, and corresponds to reference voltages VH1 and VH2 in FIG. 6 to be described later, for example. The reference voltage VL is a reference voltage for temperature compensation in, for example, a temperature range of a low temperature side, and corresponds to reference voltages VL1 and VL2 in FIG. 6, for example. The reference voltage generation circuit 36 may generate a reference voltage other than the reference voltages VH and VL used in the temperature compensation circuit 70. For example, the reference voltage generation circuit 36 may generate a reference voltage used in the oscillation circuit 30 or a reference voltage for a bias setting.

The reference current generation circuit 38 generates a reference current. For example, the reference current generation circuit 38 generates a reference current IRF based on the power supply voltage VDDL, and supplies the reference current IRF to the temperature sensor 71. The temperature sensor 71 generates and outputs the temperature detection signal such as the temperature detection voltage that changes according to a temperature of an environment based on the reference current IRF from the reference current generation circuit 38. The reference current generation circuit 38 may generate a reference current other than the reference current IRF used in the temperature sensor 71. For example, the reference current generation circuit 38 may generate a reference current used in an analog circuit other than the temperature sensor 71.

The control circuit 60 is a logic circuit and performs various types of control processes. For example, the control circuit 60 controls the entire circuit device 20 or controls an operation sequence of the circuit device 20. The control circuit 60 may control the oscillation circuit 30, the reference voltage generation circuit 36, the reference current generation circuit 38, a memory 68, the temperature compensation circuit 70, the temperature sensor 71, the output circuit 80, the power supply circuit 90, or the like. The control circuit 60 can be implemented by a circuit of an application specific integrated circuit (ASIC) based on automatic placement and wiring such as a gate array.

The power supply circuit 90 is supplied with a power supply voltage VDD and a ground voltage GND, and supplies various power supply voltages for an internal circuit of the circuit device 20 to the internal circuit. For example, the power supply circuit 90 generates the power supply voltage VDDL based on the power supply voltage VDD, and the power supply voltage VDDL is supplied as a power supply voltage of the oscillation circuit 30, the reference voltage generation circuit 36, the reference current generation circuit 38, and the like. The power supply voltage VDDL is a voltage obtained by regulating the power supply voltage VDD from, for example, the outside by a regulator, and is a voltage obtained by lowering the power supply voltage VDD. The oscillation circuit 30 performs an oscillation operation of driving the resonator 10 based on the power supply voltage VDDL to generate the oscillation signal OSC. The reference voltage generation circuit 36 generates the reference voltages VH and VL based on the power supply voltage VDDL. The reference current generation circuit 38 generates the reference current IRF based on the power supply voltage VDDL.

Here, the circuit device 20 according to the embodiment can perform switching between a first mode with low phase noise and a second mode with low power consumption. That is, the first mode is a mode in which phase noise of the output clock signal CKQ is lower than that in the second mode. On the other hand, the second mode is a mode in which power consumption of the circuit device 20 is lower than that in the first mode. For example, in the circuit device 20 according to the embodiment, the switching between the first mode and the second mode can be performed by storing switching information to a nonvolatile memory, setting a fuse in a fuse circuit, or the like. For example, by storing information in the nonvolatile memory or setting a fuse, the circuit device 20 is set to the first mode which is a low noise mode for a first product, and the circuit device 20 is set to the second mode which is a low power consumption mode for a second product. Alternatively, the first mode and the second mode may be switched by an external processing device such as microcomputer writing to a register of the circuit device 20.

In the embodiment, the control circuit 60 performs control such that the power supply voltage VDDL supplied to the oscillation circuit 30 in the first mode is higher than the power supply voltage VDDL supplied to the oscillation circuit 30 in the second mode. For example, the power supply circuit 90 supplies the power supply voltage VDDL in the first mode, which is higher than that in the second mode, to the oscillation circuit 30 based on a control signal from the control circuit 60. For example, the power supply circuit 90 includes the regulator that regulates the power supply voltage VDD from the outside or the like to generate the power supply voltage VDDL. The power supply voltage VDDL can be controlled by controlling a resistance ratio in a resistance division circuit of the regulator based on the control signal from the control circuit 60. For example, the resistance ratio in the resistance division circuit of the regulator is controlled based on the control signal from the control circuit 60, so that the power supply voltage VDDL in the first mode is higher than that in the second mode. By increasing the power supply voltage VDDL of the oscillation circuit 30 in the first mode in this manner, an amplitude of the oscillation signal OSC can be increased, and noise reduction can be implemented. For example, by increasing the amplitude of the oscillation signal OSC, it is possible to shorten a period during which both a P-type transistor and a N-type transistor of the waveform shaping circuit that performs the waveform shaping on the oscillation signal OSC are turned on, and it is possible to reduce phase noise caused by power supply noise or the like. Further, by increasing the amplitude of the oscillation signal OSC, an influence of floor noise can be reduced, and the first mode which is the low noise mode can be implemented. In the first mode, control may be performed such that a current flowing from a current source to a transistor for driving the oscillation circuit 30 is larger than that in the second mode. Accordingly, further noise reduction in the first mode can be implemented.

In the embodiment, the control circuit 60 performs control such that at least one of the reference voltages VH and VL supplied to the temperature compensation circuit 70 and the reference current IRF supplied to the temperature sensor 71 does not change between the first mode and the second mode. For example, the reference voltage generation circuit 36 supplies the reference voltages VH and VL, which are controlled so as not to change between the first mode and the second mode, to the temperature compensation circuit 70 based on the control signal from the control circuit 60. Further, for example, the reference current generation circuit 38 supplies the reference current IRF, which is controlled so as not to change between the first mode and the second mode, to the temperature sensor 71 based on the control signal from the control circuit 60.

The control for preventing the reference voltages VH and VL from changing between the first mode and the second mode is control for causing the reference voltages VH and VL in the first mode and the reference voltages VH and VL in the second mode to approach same voltages. For example, the control circuit 60 controls the reference voltages VH and VL in the first mode and the second mode to be the same voltages. The same voltage includes substantially the same voltage. The control for preventing the reference current IRF from changing between the first mode and the second mode is control for causing the reference current IRF in the first mode and the reference current IRF in the second mode to approach a same current value. For example, the control circuit 60 controls the reference currents IRF in the first mode and the second mode to be the same current value. The same current value includes substantially the same current value. FIG. 1 shows an example when both the reference voltages VH and VL and the reference current IRF are controlled so as not to change between the first mode and the second mode, but only one of the reference voltages VH, VL and the reference current IRF may be controlled so as not to change between the first mode and the second mode.

In this manner, in the embodiment, the power supply voltage VDDL supplied to the oscillation circuit 30 in the first mode is higher than that in the second mode. By increasing the power supply voltage VDDL supplied to the oscillation circuit 30 in the first mode in this manner, the first mode which is the low noise mode can be implemented. However, since the reference voltage generation circuit 36 generates the reference voltages VH and VL based on the power supply voltage VDDL, when the power supply voltage VDDL increases in the first mode, the reference voltages VH and VL may also change. For example, in the first mode, the reference voltages VH and VL may change to high voltages. When the reference voltages VH and VL change as described above, the temperature compensation in the temperature compensation circuit 70 is adversely influenced, the temperature compensation shifts, and accuracy of the temperature compensation decreases. Further, since the reference current generation circuit 38 generates the reference current IRF based on the power supply voltage VDDL, when the power supply voltage VDDL increases in the first mode, the reference current IRF may also change. For example, the reference current IRF may change to have a large current value in the first mode. When the reference current IRF changes as described above, temperature detection of the temperature sensor 71 is adversely influenced, the temperature detection signal of the temperature sensor 71 shifts, and accuracy of the temperature detection decreases. When the accuracy of the temperature detection decreases, the accuracy of the temperature compensation also decreases.

In this regard, in the embodiment, the power supply voltage VDDL supplied to the oscillation circuit 30 in the first mode is higher than that in the second mode, and the reference voltages VH and VL supplied to the temperature compensation circuit 70 and the reference current IRF supplied to the temperature sensor 71 are controlled so as not to change between the first mode and the second mode. In this manner, even if the power supply voltage VDDL increases in the first mode, the reference voltages VH and VL and the reference current IRF are controlled so as not to change, and thus, adverse influences caused by changes in the reference voltages VH, VL and the reference current IRF can be reduced. For example, it is possible to prevent the decrease in the accuracy of the temperature compensation and the decrease in the accuracy of the temperature detection. Accordingly, it is possible to prevent the accuracy of the output clock signal CKQ of the circuit device 20 from being decreased.

Figure 2:
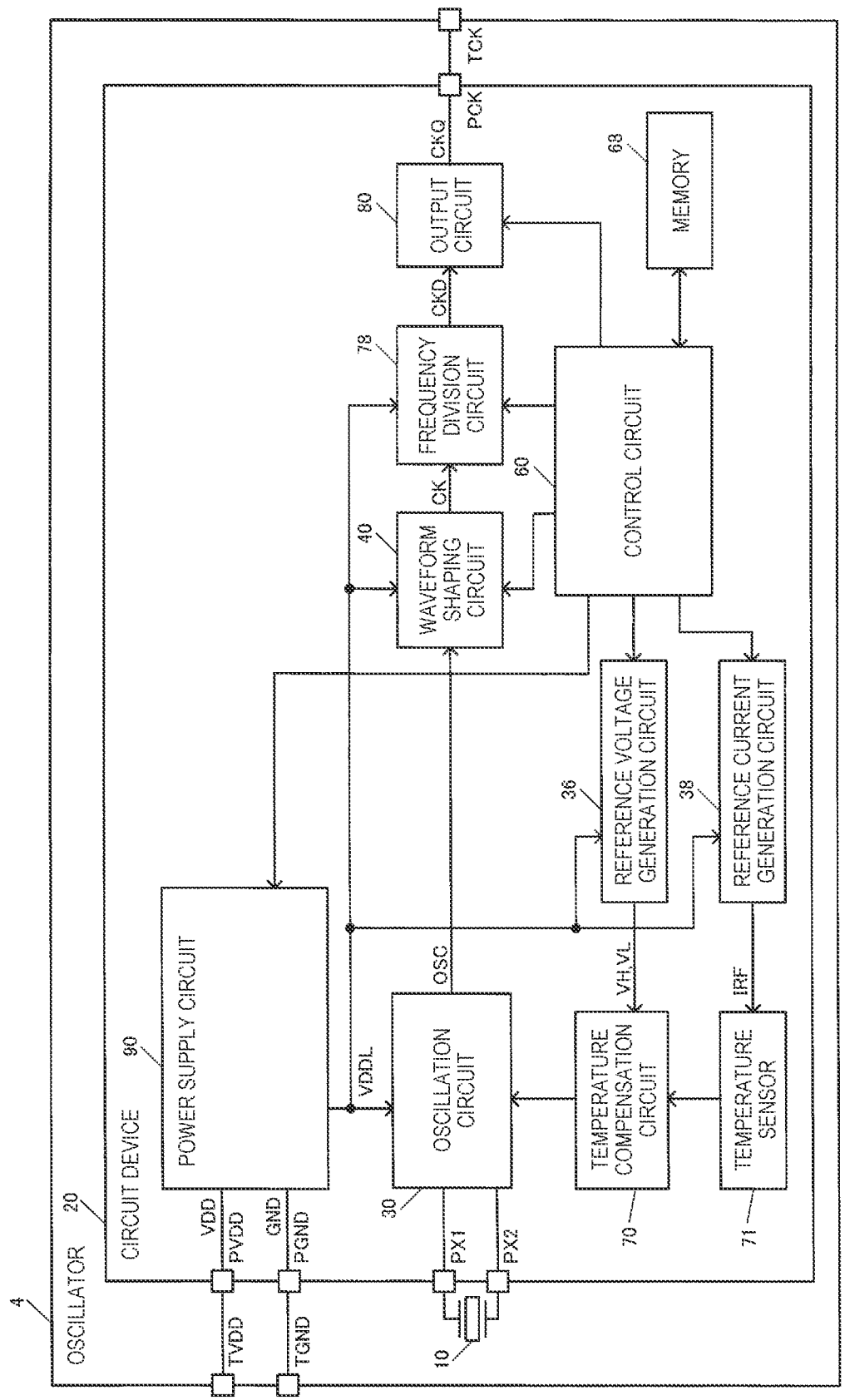
FIG. 2 shows a detailed configuration example of the circuit device and an oscillator according to the embodiment.

FIG. 2 shows a detailed configuration example of the circuit device 20 and the oscillator 4 including the circuit device 20 according to the embodiment. The oscillator 4 includes the resonator 10 and the circuit device 20. The resonator 10 is electrically coupled to the circuit device 20. For example, the resonator 10 and the circuit device 20 are electrically coupled using an internal wiring, a bonding wire, or a metal bump of a package that accommodates the resonator 10 and the circuit device 20. The circuit device 20 and the oscillator 4 are not limited to the configuration in FIG. 2 and a configuration of FIG. 3 to be described later, and various modifications can be made, such as omitting a part of components, adding other components, or replacing a part of components with other components.

The resonator 10 is an element that generates mechanical resonation by an electric signal. The resonator 10 can be implemented by a resonator element such as a quartz crystal resonator element. For example, the resonator 10 can be implemented by a quartz crystal resonator element in which a cut angle vibrates in a thickness-shear manner such as AT cut or SC cut, a tuning fork type quartz crystal resonator element, a double tuning fork type quartz crystal resonator element, or the like. For example, the resonator 10 may be a resonator built in a simple packaged crystal oscillator (SPXO), or may be a resonator built in a temperature compensated crystal oscillator (TCXO) having no thermostatic oven or a resonator built in an oven-controlled quartz crystal oscillator (OCXO) having a thermostatic oven. The resonator 10 according to the embodiment can also be implemented by various resonator elements such as a resonator element other than the thickness-shear vibrating type, the tuning fork type or the double tuning fork type resonator element, or a piezoelectric resonator element made of a material other than quartz crystal. For example, a surface acoustic wave (SAW) resonator, or a micro electro mechanical systems (MEMS) resonator as a silicon resonator formed using a silicon substrate may be adopted as the resonator 10.

The circuit device 20 is an integrated circuit device referred to as an integrated circuit (IC). For example, the circuit device 20 is an IC manufactured by a semiconductor process and is a semiconductor chip in which a circuit element is formed at a semiconductor substrate. The circuit device 20 includes pads PVDD, PGND, PX1, PX2, and PCK. A pad for output enable control of the clock signal or the like may be provided. The pads are terminals of the circuit device 20 which is the semiconductor chip. For example, in a pad area, a metal layer is exposed from a passivation film that is an insulating layer, and the exposed metal layer constitutes the pad that is the terminal of the circuit device 20. The pads PVDD and PGND are a power supply pad and a ground pad, respectively. A power supply voltage VDD from an external power supply device is supplied to the pad PVDD. The pad PGND is a pad to which GND, which is a ground voltage, is supplied. GND can also be referred to as VSS, and the ground voltage is, for example, a ground potential. In the embodiment, the ground is referred to as GND as appropriate. For example, VDD corresponds to a high-potential-side power supply voltage, and GND corresponds to a low-potential-side power supply voltage. The pads PX1 and PX2 are pads for coupling to the resonator 10. The pad PCK is a pad for outputting an output clock signal CKQ. The pads PVDD, PGND, and PCK are electrically coupled to terminals TVDD, TGND, and TCK, respectively, which are external terminals for external coupling of the oscillator 4. For example, the pads and the terminals are electrically coupled using an internal wiring, a bonding wire, or a metal bump of a package.

The oscillation circuit 30 is a circuit that oscillates the resonator 10. For example, the oscillation circuit 30 generates the oscillation signal OSC by oscillating the resonator 10. For example, the oscillation circuit 30 can be implemented by an oscillation drive circuit electrically coupled to one end and the other end of the resonator 10 and a passive element such as a capacitor or a resistor. The drive circuit can be implemented by, for example, a bipolar transistor or a CMOS inverter circuit. The drive circuit is a core circuit of the oscillation circuit 30. The drive circuit drives the resonator 10 by a voltage or a current to oscillate the resonator 10. As the oscillation circuit 30, various types of oscillation circuits such as an inverter type, a Pierce type, a Colpitts type, or a Hartley type oscillation circuit can be used. The oscillation circuit 30 is electrically coupled to the resonator 10 via the pads PX1 and PX2. The pads PX1 and PX2 are pads for coupling to the resonator. A drive circuit 34 for oscillation of the oscillation circuit 30 is provided between the pad PX1 and the pad PX2. The oscillation circuit 30 may include a variable capacitance circuit (not shown). The variable capacitance circuit is, for example, a circuit that changes a capacitance of at least one of one end and the other end of the resonator 10, and an oscillation frequency of the oscillation circuit 30 can be adjusted by adjusting the capacitance of the variable capacitance circuit. That is, by electrically coupling the variable capacitance circuit to at least one of the pads PX1 and PX2, a load capacitance of the oscillation circuit 30 can be variably adjusted. The variable capacitance circuit can be implemented by a variable capacitance element such as a varactor. For example, the variable capacitance circuit includes at least one variable capacitance element. The coupling in the embodiment is electrical coupling. The electrical coupling is coupling in which an electrical signal can be transmitted and information can be transmitted through the electrical signal. The electrical coupling may be coupling via a passive element and the like.

The waveform shaping circuit 40 receives the oscillation signal OSC from the oscillation circuit 30 and performs the waveform shaping on the oscillation signal OSC. For example, the waveform shaping circuit 40 performs the waveform shaping on the oscillation signal OSC so as to obtain the rectangular wave clock signal CK. For example, the waveform shaping circuit 40 performs the waveform shaping on the sine wave oscillation signal OSC and outputs the rectangular wave clock signal CK. The sine wave oscillation signal OSC includes a sine wave signal including a high modulation wave component. The waveform shaping circuit 40 can include one or more buffer circuits for performing the waveform shaping on the oscillation signal OSC.

The memory 68 stores various types of information used in the circuit device 20. The memory 68 is, for example, a nonvolatile memory. Although the nonvolatile memory is an EEPROM such as a floating gate avalanche injection MOS (FAMOS) memory or a metal-oxide-nitride-oxide-silicon (MONOS) memory, the nonvolatile memory is not limited thereto and may be a one time programmable (OTP) memory or a fuse ROM. Alternatively, the memory 68 may be implemented by a volatile memory such as a RAM.

A frequency division circuit 78 outputs a clock signal CKD obtained by dividing a frequency of the clock signal CK from the waveform shaping circuit 40 by a set frequency division ratio. Setting information of the frequency division ratio is stored in, for example, the memory 68 or the register. Accordingly, the output circuit 80 can output the output clock signal CKQ corresponding to the clock signal CKD whose frequency is divided by the frequency division circuit 78. Alternatively, the PLL circuit that multiplies the frequency of the clock signal CK may be provided between the waveform shaping circuit 40 and the output circuit 80. In this manner, the output circuit 80 can output the output clock signal CKQ having a frequency obtained by multiplying the oscillation frequency. Further, the circuit device 20 according to the embodiment may have a configuration in which the frequency division circuit 78 and the PLL circuit are not provided.

The output circuit 80 buffers and outputs the clock signal CK generated based on the oscillation signal OSC. For example, the output circuit 80 outputs the output clock signal CKQ based on the clock signal CK of the waveform shaping circuit 40. In FIG. 2, the output circuit 80 buffers the clock signal CKD from the frequency division circuit 78 and outputs the buffered clock signal CK as the output clock signal CKQ to the pad PCK. For example, the output circuit 80 outputs the output clock signal CKQ in a single-ended CMOS signal format. Alternatively, the output circuit 80 outputs a differential clock signal in a signal format such as low voltage differential signaling (LVDS), positive emitter coupled logic (PECL), high speed current steering logic (HCSL), or differential complementary MOS (CMOS).

The power supply circuit 90 is supplied with the power supply voltage VDD from the pad PVDD and the ground voltage GND from the pad PGND, and supplies various power supply voltages for an internal circuit of the circuit device 20 to the internal circuit. For example, in FIG. 2, the power supply circuit 90 generates the power supply voltage VDDL based on the power supply voltage VDD, and the power supply voltage VDDL is supplied as a power supply voltage of the oscillation circuit 30, the waveform shaping circuit 40, the frequency division circuit 78, the reference voltage generation circuit 36, and the reference current generation circuit 38. The power supply voltage VDDL is a voltage obtained by regulating the power supply voltage VDD from, for example, the outside by a regulator, and is a voltage obtained by lowering the power supply voltage VDD. The oscillation circuit 30 performs an oscillation operation of driving the resonator 10 based on the power supply voltage VDDL to generate the oscillation signal OSC. In addition, the waveform shaping circuit 40 performs the waveform shaping on the oscillation signal OSC based on the power supply voltage VDDL, and outputs the clock signal CK after being subjected to the waveform shaping. The power supply circuit 90 can also generate a power supply voltage to be supplied to the control circuit 60, the memory 68, the temperature compensation circuit 70, the temperature sensor 71, or the like. The output circuit 80 operates based on, for example, the power supply voltage VDD and outputs the output clock signal CKQ.

Figure 3:
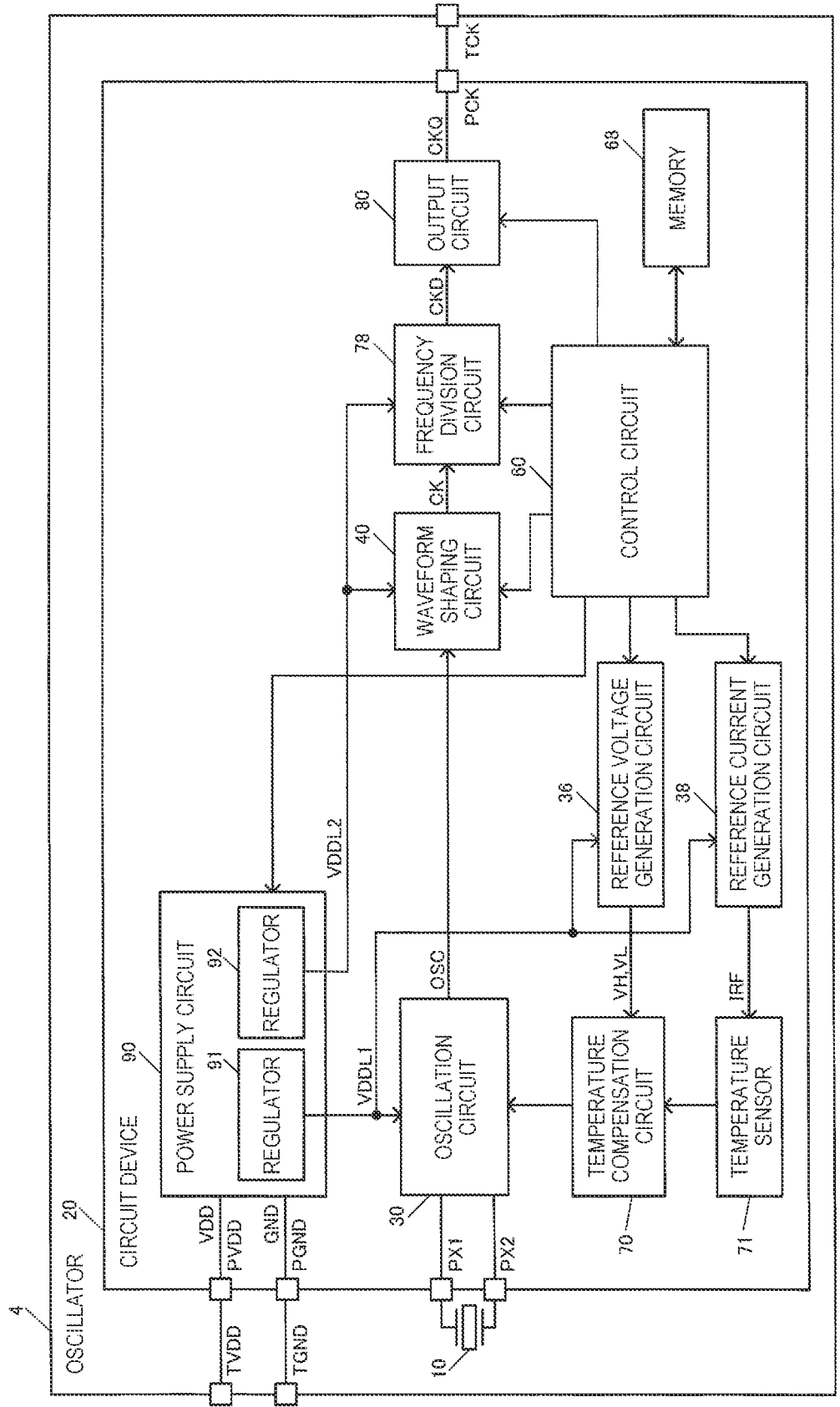
FIG. 3 shows another detailed configuration example of the circuit device and the oscillator according to the embodiment.

FIG. 3 shows another configuration example of the circuit device 20 and the oscillator 4. FIG. 3 is different from FIG. 2 in that the power supply circuit 90 in FIG. 3 supplies a first power supply voltage VDDL1 to the oscillation circuit 30 and supplies a second power supply voltage VDDL2 different from the first power supply voltage VDDL1 to the waveform shaping circuit 40. In FIG. 3, the first power supply voltage VDDL1 is supplied to the reference voltage generation circuit 36 and the reference current generation circuit 38, and the second power supply voltage VDDL2 is supplied to the frequency division circuit 78. Specifically, the power supply circuit 90 includes regulators 91 and 92. The regulator 91 regulates the power supply voltage VDD to generate the first power supply voltage VDDL1, and the regulator 92 regulates the power supply voltage VDD to generate the second power supply voltage VDDL2.

In this manner, in FIG. 3, the oscillation circuit 30 operates by being supplied with the first power supply voltage VDDL1, and the waveform shaping circuit 40 operates by being supplied with the second power supply voltage VDDL2 different from the first power supply voltage VDDL1. In this manner, it becomes possible to individually adjust the first power supply voltage VDDL1 supplied to the oscillation circuit 30 and the second power supply voltage VDDL2 supplied to the waveform shaping circuit 40. Accordingly, the low noise mode and the low power consumption mode can be finely adjusted.

For example, the waveform shaping circuit 40 is supplied with the second power supply voltage VDDL2 smaller than the amplitude of the oscillation signal OSC and operates. For example, an amplitude detection circuit (not shown) that detects the amplitude of the oscillation signal OSC is provided, and the power supply circuit 90 controls the second power supply voltage VDDL2 so as to be smaller than the amplitude of the oscillation signal OSC based on a detection result of an oscillation amplitude. Specifically, the second power supply voltage VDDL2 can be controlled by controlling a resistance ratio in a resistance division circuit of the regulator 92 based on the detection result of the oscillation amplitude. The amplitude of the oscillation signal OSC is, for example, a peak-to-peak voltage of the oscillation signal OSC. The amplitude of the oscillation signal OSC can be detected by, for example, detecting an envelope of the oscillation signal OSC. By making the second power supply voltage VDDL2 to be smaller than the amplitude of the oscillation signal OSC in this manner, the phase noise of the clock signal CK can be reduced and the phase noise of the output clock signal CKQ can be reduced as described later.

Also in FIGS. 2 and 3, in the embodiment, the power supply voltage VDDL or the first power supply voltage VDDL1 supplied to the oscillation circuit 30 in the first mode is controlled to be higher than the power supply voltage VDDL or the first power supply voltage VDDL1 supplied to the oscillation circuit 30 in the second mode. At least one of the reference voltages VH and VL supplied to the temperature compensation circuit 70 based on the power supply voltage VDDL or the first power supply voltage VDDL1 and the reference current IRF supplied to the temperature sensor 71 based on the power supply voltage VDDL or the first power supply voltage VDDL1 is controlled so as not to change between the first mode and the second mode. In this manner, the power supply voltage VDDL or the first power supply voltage VDDL1 supplied to the oscillation circuit 30 in the first mode is higher than that in the second mode, so that the noise reduction can be implemented. In the embodiment, even when the power supply voltage VDDL or the first power supply voltage VDDL1 increases in the first mode, the reference voltages VH and VL supplied to the temperature compensation circuit 70 or the reference current IRF supplied to the temperature sensor 71 is controlled so as not to change.

Accordingly, it is possible to prevent the decrease in the accuracy of the temperature compensation or the accuracy of the temperature detection due to a change in the power supply voltage VDDL or the first power supply voltage VDDL1, and it is possible to prevent the decrease in the accuracy of the output clock signal CKQ or the like. In the following description, the first power supply voltage VDDL1 and the second power supply voltage VDDL2 shown in FIG. 3 are collectively referred to as the power supply voltage VDDL.

Figure 4:
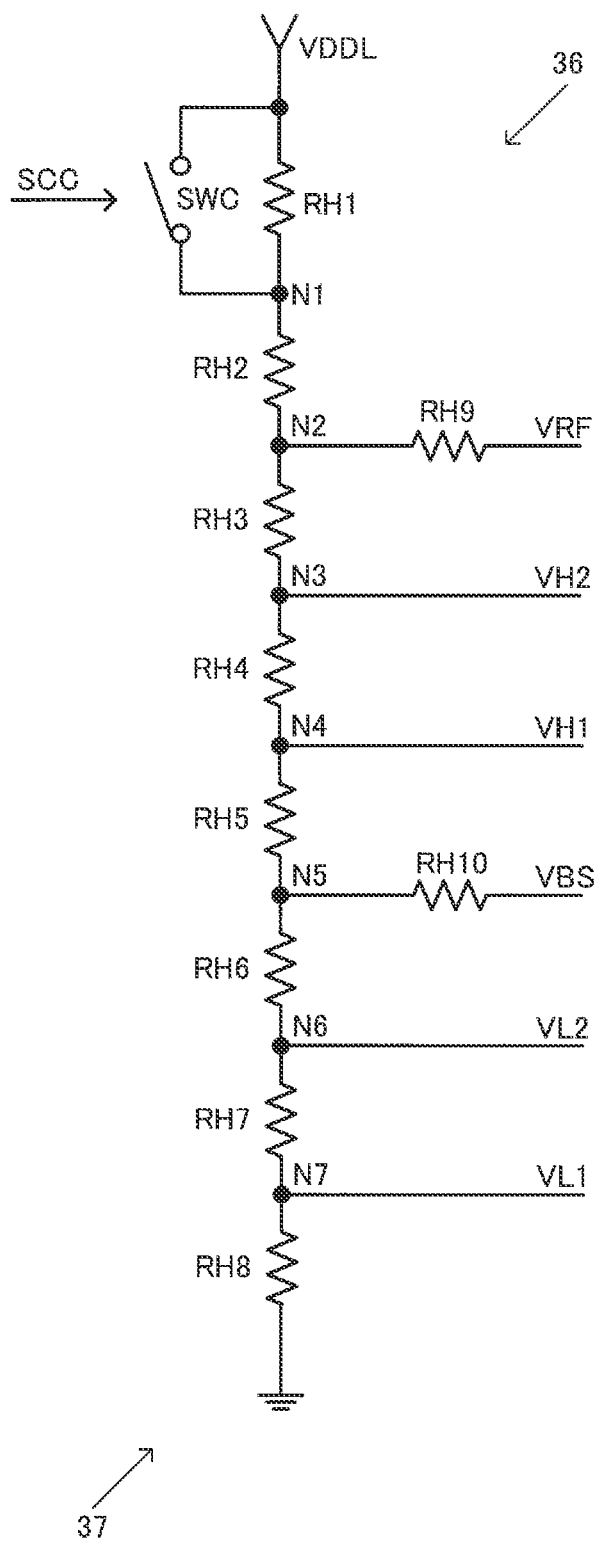
FIG. 4 shows a configuration example of a reference voltage generation circuit.

2. Reference Voltage Generation Circuit, Reference Current Generation Circuit, and Temperature Compensation Circuit FIG. 4 shows a configuration example of the reference voltage generation circuit 36. The reference voltage generation circuit 36 is not limited to the configuration in FIG. 4, and various modifications can be made, such as omitting a part of components, adding other components, or replacing a part of components with other components.

In the embodiment, the circuit device 20 includes the reference voltage generation circuit 36 that generates the reference voltages VH and VL based on the power supply voltage VDDL, and supplies the reference voltages VH and VL to the temperature compensation circuit 70. The reference voltage generation circuit 36 supplies the reference voltages VH and VL, which are controlled so as not to change between the first mode and the second mode, to the temperature compensation circuit 70. In this manner, even when the power supply voltage VDDL supplied to the oscillation circuit 30 increases in the first mode, the reference voltages VH and VL controlled so as not to change between the first mode and the second mode are supplied from the reference voltage generation circuit 36 to the temperature compensation circuit 70. Accordingly, by increasing the power supply voltage VDDL supplied to the oscillation circuit 30, the first mode which is the low noise mode can be implemented, it is possible to prevent the decrease in the accuracy of the temperature compensation due to the change in the power supply voltage VDDL, and it is possible to prevent the decrease in the accuracy of the output clock signal CKQ.

Specifically, as shown in FIG. 4, the reference voltage generation circuit 36 includes a plurality of resistors RH1 to RH8 provided in series between a power supply node to which the power supply voltage VDDL is supplied and a GND node. The reference voltage generation circuit 36 may further include resistors RH9 and RH10. A ladder resistance circuit 37 includes the resistors RH1 to RH8. The reference voltage generation circuit 36 includes a switch SWC provided in parallel with one of the plurality of resistors RH1 to RH8. In FIG. 4, the switch SWC is provided in parallel with the resistor RH1 having one end coupled to the power supply node of the VDDL and the other end coupled to the node N1. The switch SWC is controlled to be turned on and off by a control signal SCC from the control circuit 60. The switch SWC can be implemented by, for example, a MOS transistor. In FIG. 4, an example in which the eight resistors RH1 to RH8 are provided as the plurality of resistors is shown, but the number of resistors is not limited thereto. The resistor provided in parallel with the switch SWC may be a resistor other than the resistor RH1.

A voltage generated at a node N2 between the resistors RH2 and RH3 is output as a reference voltage VRF via the resistor RH9. The reference voltage VRF is supplied to, for example, one end of the variable capacitance element of the oscillation circuit 30 to be described later. The temperature compensation voltage is supplied to the other end of the variable capacitance element. When the oscillation circuit 30 includes a plurality of variable capacitance elements, a plurality of reference voltages VRF having different voltage levels are generated and supplied to one ends of the plurality of variable capacitance elements. A voltage generated at a node N5 between the resistors RH5 and RH6 is output as a bias voltage VBS via the resistor RH10. The bias voltage VBS is, for example, set as a center amplitude voltage of the oscillation signal OSC of the oscillation circuit 30 to be described later.

The reference voltages VH2, VH1, VL2, and VL1 used in the temperature compensation circuit 70 are generated at a node N3 between the resistors RH3 and RH4, a node N4 between the resistors RH4 and RH5, a node N6 between the resistors RH6 and RH7, and a node N7 between the resistors RH7 and RH8. The reference voltages VH2 and VH1 correspond to the reference voltage VH described above, and the reference voltages VL2 and VL1 correspond to the reference voltage VL. The temperature compensation circuit 70 generates the temperature compensation voltage using a function current generated based on the reference voltages VH2, VH1, VL2, and VL1 and the temperature detection voltage.

In the embodiment, the switch SWC is turned off in the first mode which is the low noise mode, and the switch SWC is turned on in the second mode which is the low power consumption mode. For example, based on the control signal SCC from the control circuit 60, the switch SWC is turned off in the first mode, and the switch SWC is turned on in the second mode. In this manner, in the second mode in which the power supply voltage VDDL is set to a low voltage for low power consumption, by turning on the switch SWC, both ends of the resistor RH1 among the plurality of resistors RH1 to RH8 are bypassed by the switch SWC. Accordingly, the reference voltages VH2, VH1, VL2, and VL1 set by a resistance division ratio of the plurality of resistors RH2 to RH8 excluding the resistor RH1 are supplied to the temperature compensation circuit 70. On the other hand, in the first mode in which the power supply voltage VDDL is set to a high voltage for noise reduction, by turning off the switch SWC, both ends of the resistor RH1 are not bypassed. Accordingly, the reference voltages VH2, VH1, VL2, and VL1 set by the resistance division ratio of the plurality of resistors RH1 to RH8 obtained by adding the resistor RH1 to the resistors RH2 to RH8 are supplied to the temperature compensation circuit 70. Therefore, even when the power supply voltage VDDL increases in the first mode, it is possible to perform control such that the reference voltages VH2, VH1, VL2, and VL1 do not change between the first mode and the second mode. Accordingly, it is possible to prevent the decrease in the accuracy of the temperature compensation due to the change in the power supply voltage VDDL, and it is possible to prevent the decrease in the accuracy of the output clock signal CKQ or the like.

For example, a current flowing through the plurality of resistors is set to IA, the power supply voltage VDDL in the first mode is set to V1, and the power supply voltage VDDL in the second mode is set to V2. Here, since the power supply voltage VDDL in the first mode is higher than that in the second mode, a relational expression of V1>V2 is established. Resistance values of the resistor RH1 provided in parallel with the switch SWC and the resistors RH2 to RH8 are R1 to R8. In this case, in the first mode in which the power supply voltage VDDL is V1 and the switch SWC is turned off, V1=(R1+R2+R3+ .... R8)×IA. In the second mode in which the power supply voltage VDDL is V2 and the switch SWC is turned on, V2=(R2+R3+ .... R8)×IA. Accordingly, a resistance value R1 of the resistor RH1 provided in parallel with the switch SWC satisfies a relationship of R1=(V1−V2)/IA. If the resistance value of the resistor RH1 provided in parallel with the switch SWC is set to R1=(V1−V2)/IA in this manner, even when the power supply voltage VDDL=V1 in the first mode is set to a voltage higher than the power supply voltage VDDL=V2 in the second mode, the reference voltages VH2, VH1, VL2, and VL1 can be controlled so as not to change. That is, the voltage at the node N1 does not change between the first mode and the second mode by lowering the voltage at the resistor RH1 provided in parallel with the switch SWC by a voltage of V1−V2 where the power supply voltage VDDL is risen from V2 to V1 in the first mode. Accordingly, even when the power supply voltage VDDL increases in the first mode, the reference voltages VH2, VH1, VL2, and VL1 do not change. Accordingly, it is possible to implement the noise reduction by increasing the power supply voltage VDDL in the first mode, and it is also possible to prevent the accuracy of the temperature compensation from being decreased due to the change in the power supply voltage VDDL.

Figure 5:
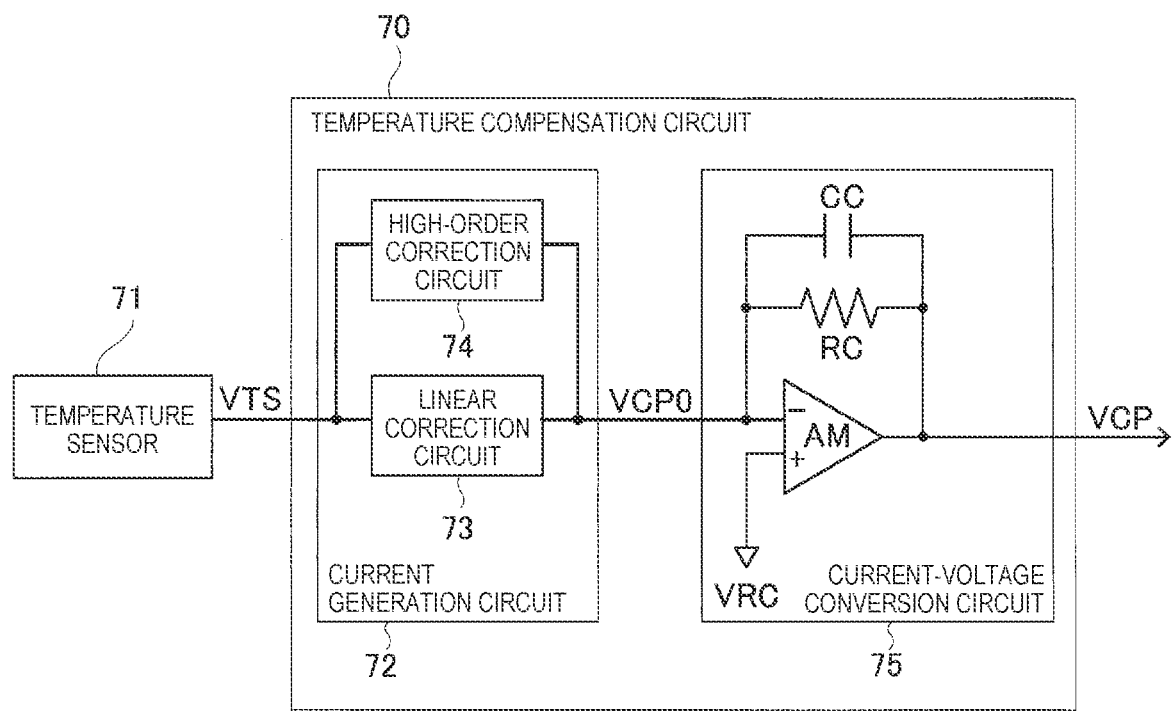
FIG. 5 shows a configuration example of a temperature compensation circuit.

FIG. 5 shows a configuration example of the temperature compensation circuit 70. FIG. 5 shows a circuit that performs the temperature compensation in the analog manner, and outputs a temperature compensation voltage VCP by polynomial approximation using a temperature as a variable. The temperature compensation circuit 70 includes a current generation circuit 72 and a current-voltage conversion circuit 75. The current generation circuit 72 generates a function current for performing the temperature compensation on a temperature characteristic of the oscillation frequency, based on a temperature detection voltage VTS from the temperature sensor 71. The current-voltage conversion circuit 75 converts the function current from the current generation circuit 72 into a voltage and outputs the temperature compensation voltage VCP.

The current generation circuit 72 includes a linear correction circuit 73 and a high-order correction circuit 74. The linear correction circuit 73 outputs a linear current approximating a linear function based on the temperature detection voltage VTS. For example, the linear correction circuit 73 outputs a linear current based on linear correction data corresponding to a linear coefficient of a polynomial in the polynomial approximation. The high-order correction circuit 74 outputs a high-order current approximating a high-order function to the current-voltage conversion circuit 75 based on the temperature detection voltage VTS. For example, the high-order correction circuit 74 outputs a high-order current based on high-order correction data corresponding to a high-order coefficient of a polynomial in the polynomial approximation. For example, the high-order correction circuit 74 outputs a cubic current approximating a cubic function. In addition, the high-order correction circuit 74 may further include a correction circuit that performs quartic or higher-order correction.

The current-voltage conversion circuit 75 includes an amplifier circuit AM, a resistor RC, and a capacitor CC. The current-voltage conversion circuit 75 adds the linear current and the high-order current, and performs current-voltage conversion on the added current to output the temperature compensation voltage VCP. Accordingly, the temperature compensation voltage VCP approximating a polynomial function is generated.

Figure 6:
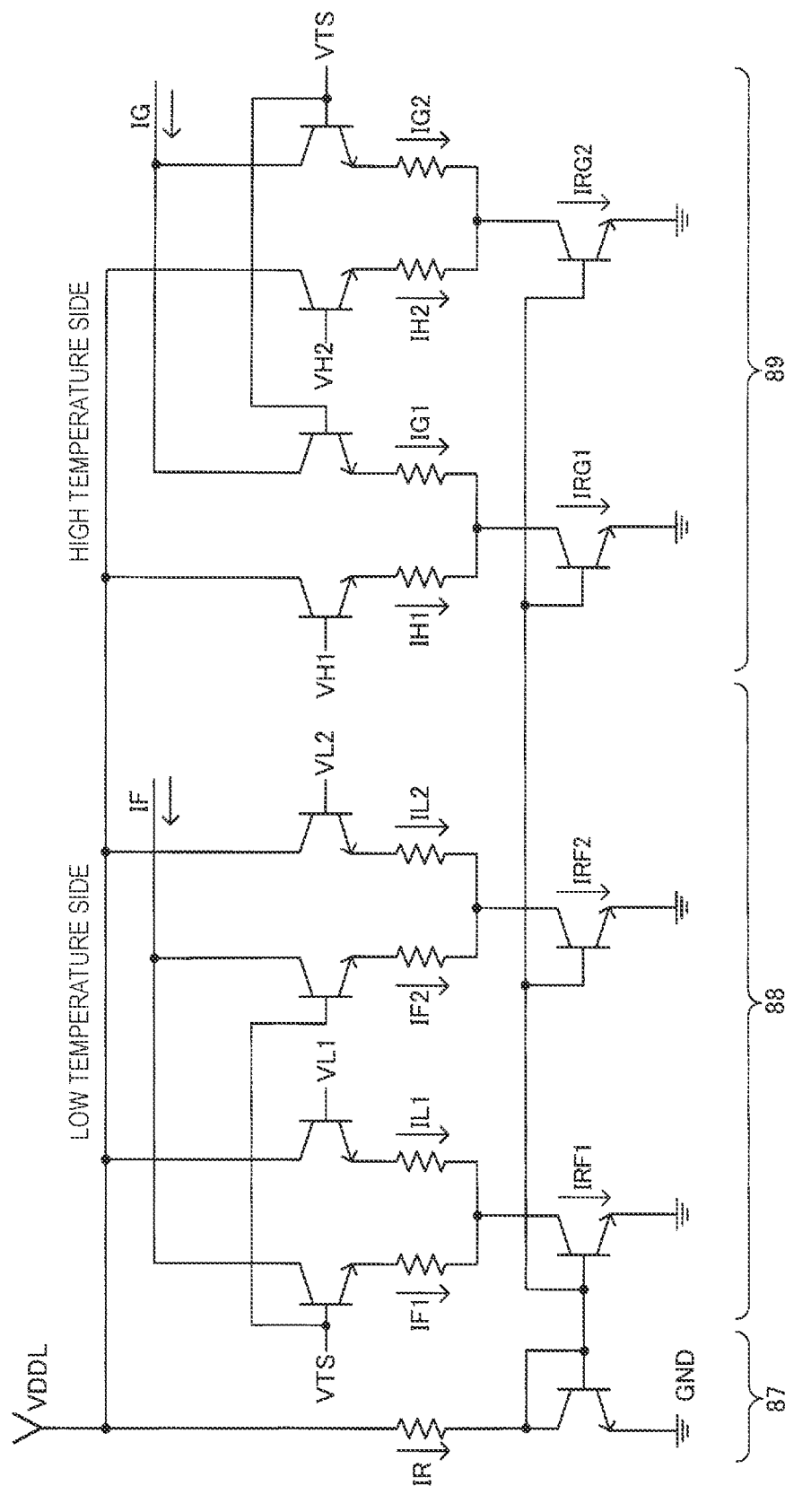
FIG. 6 shows a configuration example of a function current generation circuit of the temperature compensation circuit.

FIG. 6 shows a configuration example of a function current generation circuit 86 provided in the temperature compensation circuit 70. The function current generation circuit 86 is provided, for example, in the high-order correction circuit 74 in FIG. 5, and generates high-order function currents such as quadratic and cubic function currents.

As shown in FIG. 6, the function current generation circuit 86 includes a reference current generation circuit 87, a first compensation circuit 88, and a second compensation circuit 89. The reference current generation circuit 87 generates a reference current IR. The first compensation circuit 88 performs temperature compensation in the temperature range of the low temperature side, and the second compensation circuit 89 performs temperature compensation in the temperature range of the high temperature side. The first compensation circuit 88 and the second compensation circuit 89 include a plurality of differential pair circuits. Reference currents IRF1 and IRF2 obtained by mirroring the reference current IR flow through the differential pair circuits of the first compensation circuit 88. Reference currents IRG1 and IRG2 obtained by mirroring the reference current IR also flow through the differential pair circuits of the second compensation circuit 89. The first compensation circuit 88 generates a current IF=IF1+IF2 for the temperature compensation in the temperature range of the low temperature side, and the second compensation circuit 89 generates a current IG=IG1+IG2 for the temperature compensation in the temperature range of the high temperature side. Since the reference current IR is a constant current, the reference current IRF1=IF1+IL1 and the reference current IRF2=IF2+IL2 flowing through the differential pair circuits of the first compensation circuit 88 are also constant currents having constant current values. The reference current IRG1=IG1+IH1 and the reference current IRG2=IG2+IH2 flowing through the differential pair circuits of the second compensation circuit 89 are also constant currents having constant current values.

Figure 7:
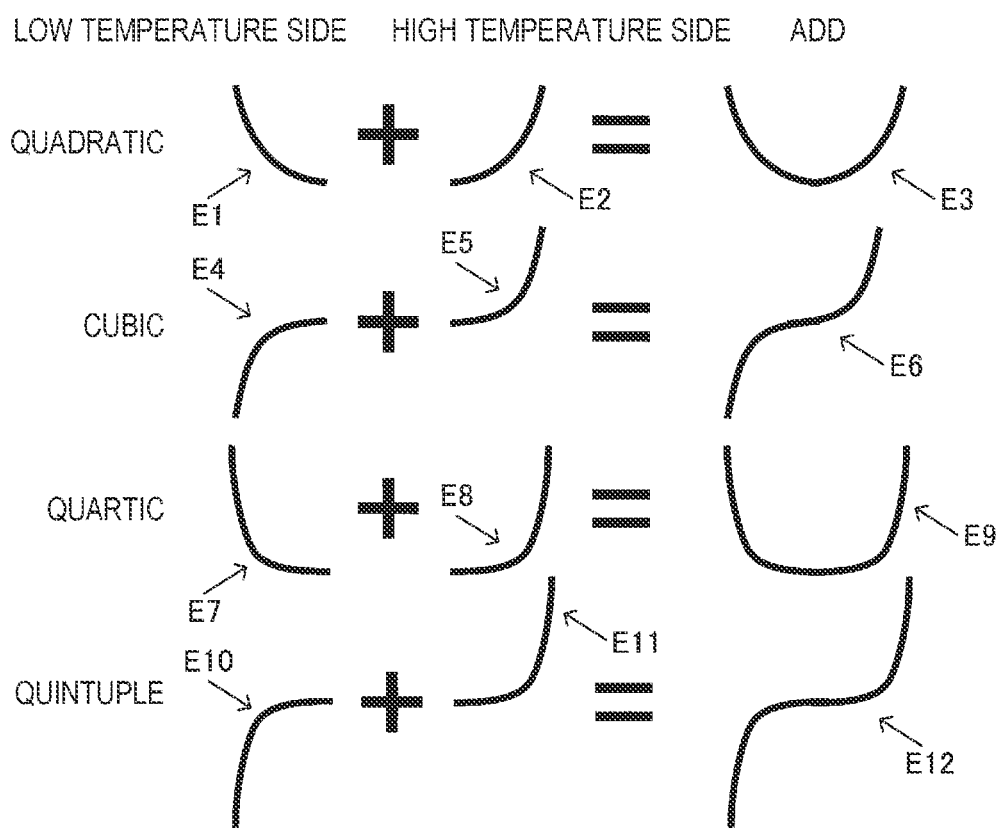
FIG. 7 is a schematic diagram showing generation of a function current.

In the temperature range of the low temperature side, the current IF=IF1+IF2 increases, whereas the current IG=IG1+IG2 decreases. On the other hand, in the temperature range of the high temperature side, the current IG=IG1+IG2 increases, whereas the current IF=IF1+IF2 decreases. By using such a function current generation circuit 86, it is possible to generate a high-order function current such as a quadratic, cubic, quartic, and quintuple function currents. For example, FIG. 7 is a diagram schematically showing the generation of the quadratic, cubic, quartic, and quintuple function currents. For example, the quadratic function current is generated by adding, as indicated by E3, a current on the low temperature side indicated by E1 and a current on the high temperature side indicated by E2. The cubic function current is generated by adding, as indicated by E6, a current on the low temperature side indicated by E4 and a current on the high temperature side indicated by E5. The quartic function current is generated by adding, as indicated by E9, a current on the low temperature side indicated by E7 and a current on the high temperature side indicated by E8. The quintuple function current is generated by adding, as indicated by E12, a current on the low temperature side indicated by E10 and a current on the high temperature side indicated by E11.

Here, as shown in FIG. 6, the temperature detection voltage VTS from the temperature sensor 71 is input to a base of one bipolar transistor constituting each differential pair circuit of the function current generation circuit 86, and the reference voltages VL1, VL2, VH1, and VH2 from the reference voltage generation circuit 36 are input to a base of the other bipolar transistor. Then, current generation temperatures on the low temperature side and the high temperature side are adjusted by the reference voltages VL1, VL2, VH1, and VH2. When a resistance value of a resistor provided on a low potential side of the differential pair circuit is reduced, the current becomes exponential, and when the resistance value is increased, the current becomes linear.

In this manner, in FIG. 6, a characteristic of the function current generated by the function current generation circuit 86 changes based on the reference voltages VL1, VL2, VH1, and VH2 from the reference voltage generation circuit 36. In the oscillator 4, the reference voltages VL1, VL2, VH1, and VH2 are adjusted, so that the function current generated by the function current generation circuit 86 has characteristics corresponding to the characteristics of the resonator 10. Therefore, it is desirable that the reference voltages VL1, VL2, VH1, and VH2 do not change when the circuit device 20 or the oscillator 4 is set to the first mode and when the circuit device 20 or the oscillator 4 is set to the second mode. In this regard, in the embodiment, for example, even when the power supply voltage VDDL is set to a high voltage in the first mode, the reference voltages VL1, VL2, VH1, and VH2 generated based on the power supply voltage VDDL are controlled so as not to change. Therefore, both when the first mode is set and when the second mode is set, the accuracy of the temperature compensation performed by the temperature compensation circuit 70 can be maintained.

Figure 8:
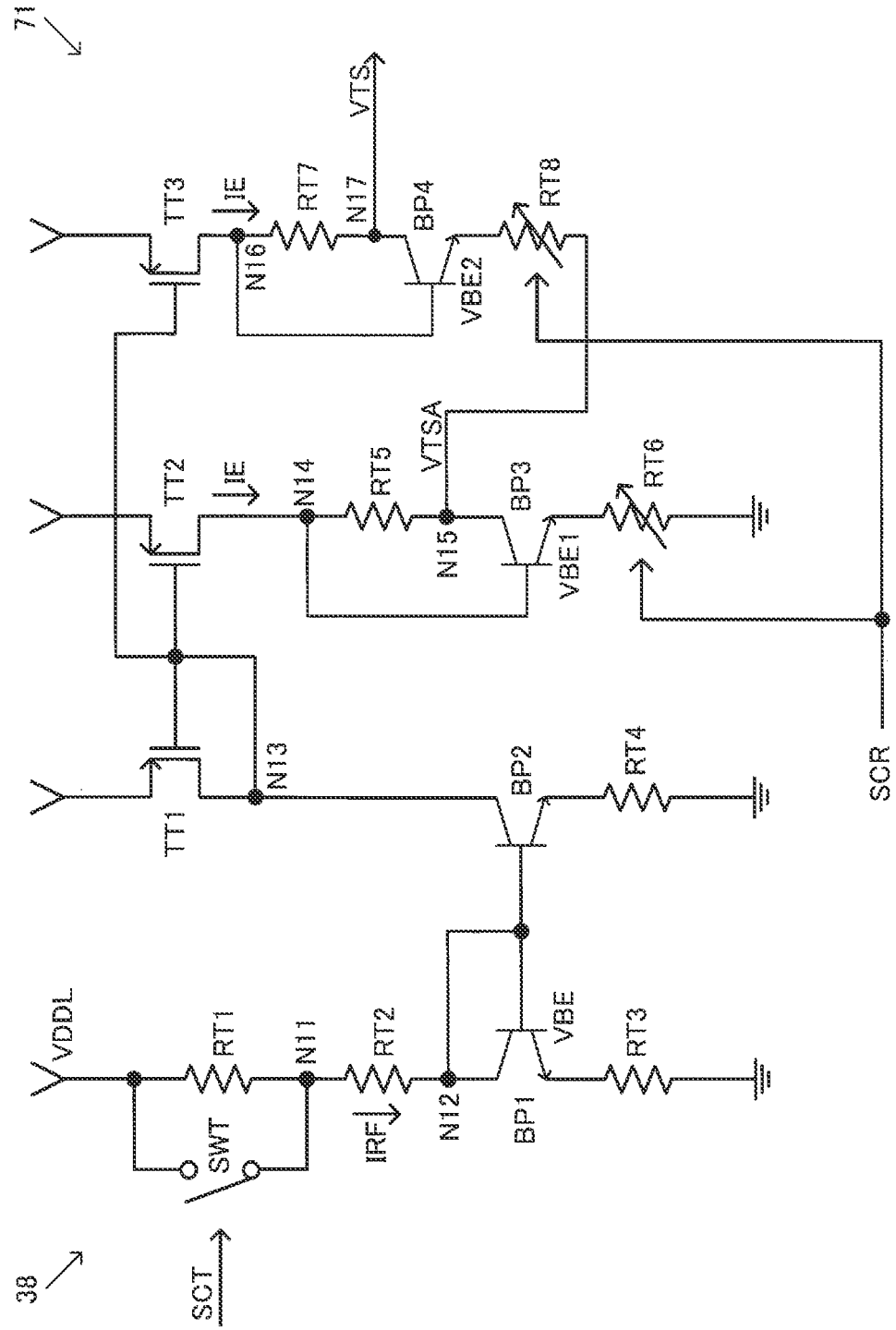
FIG. 8 shows a configuration example of a temperature sensor.

FIG. 8 shows a configuration example of the reference current generation circuit 38 and the temperature sensor 71. The reference current generation circuit 38 and the temperature sensor 71 are not limited to the configuration in FIG. 8, and various modifications can be made, such as omitting a part of components, adding other components, or replacing a part of components with other components.

In the embodiment, the circuit device 20 includes the reference current generation circuit 38 that generates the reference current IRF based on the power supply voltage VDDL, and supplies the reference current IRF to the temperature sensor 71. The reference current generation circuit 38 supplies the reference current IRF, which is controlled such that the current does not change between the first mode and the second mode, to the temperature sensor 71 based on the control signal from the control circuit 60. In this manner, even when the power supply voltage VDDL supplied to the oscillation circuit 30 increases in the first mode, the reference current IRF controlled so as not to change between the first mode and the second mode is supplied from the reference current generation circuit 38 to the temperature sensor 71. Accordingly, by increasing the power supply voltage VDDL supplied to the oscillation circuit 30, the first mode which is the low noise mode can be implemented, it is possible to prevent the decrease in the accuracy of the temperature detection and the accuracy of the temperature compensation due to the change in the power supply voltage VDDL, and it is possible to prevent the decrease in the accuracy of the output clock signal CKQ.

As shown in FIG. 8, the reference current generation circuit 38 includes a plurality of resistors RT1, RT2, and RT3 and a bipolar transistor BP1 provided in series between the power supply node to which the power supply voltage VDDL is supplied and the GND node. For example, the resistors RT1 and RT2 are provided in series between the power supply node and a node N12, and the bipolar transistor BP1 and the resistor RT3 are provided in series between the node N12 and the GND node. A collector and a base of the bipolar transistor BP1 are coupled to each other to form a diode coupling configuration. The reference current generation circuit 38 includes a switch SWT provided in parallel with one of the plurality of resistors RT1, RT2, and RT3. In FIG. 8, the switch SWT is provided in parallel with the resistor RT1 having one end coupled to the power supply node of the VDDL and the other end coupled to a node N11. The switch SWT is controlled to be turned on and off by a control signal SCT from the control circuit 60. The switch SWT can be implemented by, for example, a MOS transistor. In FIG. 8, an example in which the three resistors RT1 to RT3 are provided as the plurality of resistors is shown, but the number of resistors is not limited thereto. The resistor provided in parallel with the switch SWT may be a resistor other than the resistor RT1.

In the embodiment, the switch SWT is turned off in the first mode which is the low noise mode, and the switch SWT is turned on in the second mode which is the low power consumption mode. For example, based on the control signal SCT from the control circuit 60, the switch SWT is turned off in the first mode, and the switch SWT is turned on in the second mode. In this manner, in the second mode in which the power supply voltage VDDL is set to a low voltage for low power consumption, by turning on the switch SWT, both ends of the resistor RT1 are bypassed by the switch SWT. Accordingly, the reference current IRF flows from the power supply node to the GND node via the resistor RT2, the bipolar transistor BP1, and the resistor RT3. On the other hand, in the first mode in which the power supply voltage VDDL is set to a high voltage for noise reduction, by turning off the switch SWT, both ends of the resistor RT1 are not bypassed. Accordingly, the reference current IRF flows from the power supply node to the GND node via the resistors RT1 and RT2, the bipolar transistor BP1, and the resistor RT3. That is, in the second mode in which the power supply voltage VDDL is low, the reference current IRF flows through the two resistors RT2 and RT3, whereas in the first mode in which the power supply voltage VDDL is high, the reference current IRF flows through the three resistors RT1, RT2, and RT3, which is more than that in the second mode. Accordingly, even when the power supply voltage VDDL increases in the first mode, it is possible to perform control such that the reference current IRF do not change between the first mode and the second mode. Therefore, it is possible to prevent the decrease in the accuracy of the temperature detection and the accuracy of the temperature compensation due to the change in the power supply voltage VDDL, and it is possible to prevent the decrease in the accuracy of the output clock signal CKQ or the like.

For example, the power supply voltage VDDL in the first mode is set to V1, and the power supply voltage VDDL in the second mode is set to V2. A resistance value of the resistor RT1 provided in parallel with the switch SWT is set to R1, resistance values of the resistors RT2 and RT3 are set to R2 and R3, and a base-emitter voltage of the bipolar transistor BP1 whose base and collector are coupled is set to VBE. In this case, in the first mode in which the power supply voltage VDDL is V1 and the switch SWT is turned off, V1−VBE=(R1+R2+R3)×IRF. In the second mode in which the power supply voltage VDDL is V2 and the switch SWT is turned on, V2−VBE=(R2+R3)×IRF. Therefore, the resistance value R1 of the resistor RT1 provided in parallel with the switch SWT satisfies a relational expression of R1=(V1−V2)/IRF. When the resistance value of the resistor RT1 provided in parallel with the switch SWT is set to R1=(V1−V2)/IRF in this manner, even when the power supply voltage VDDL=V1 in the first mode is set to a voltage higher than the power supply voltage VDDL=V2 in the second mode, the reference current IRF can be controlled so as not to change. That is, the voltage at the node N11 does not change between the first mode and the second mode by lowering the voltage at the resistor RT1 provided in parallel with the switch SWT by the voltage of V1−V2 where the power supply voltage VDDL is risen from V2 to V1 in the first mode. Therefore, even when the power supply voltage VDDL increases in the first mode, the base-emitter voltage VBE of the bipolar transistor BP1 and the reference current IRF whose current value is defined by the resistance values of the resistors RT2 and RT3 does not change. Accordingly, it is possible to implement the noise reduction by increasing the power supply voltage VDDL in the first mode, and it is also possible to prevent the accuracy of the temperature detection and the accuracy of the temperature compensation from being decreased due to the change in the power supply voltage VDDL.

In FIG. 8, a transistor TT1, a bipolar transistor BP2, and a resistor RT4 are provided in series between the power supply node and the GND node. The bipolar transistor BP2 is coupled to the node N12 of the base and the collector of the bipolar transistor BP1, and a current mirror circuit includes the bipolar transistors BP1 and BP2. Gates of transistors TT2 and TT3, which are current sources of the temperature sensor 71, are coupled to a node N13 of a gate and a drain of the transistor TT1, and a current mirror circuit includes the transistors TT1 and TT2 and the transistors TT1 and TT3. Accordingly, a current IE obtained by mirroring the reference current IRF flows through the transistors TT2 and TT3 that are the current sources of the temperature sensor 71.

The temperature sensor 71 includes a bipolar transistor BP3 whose collector is supplied with the current IE obtained by mirroring the reference current IRF, and resistors RT5 and RT6. The resistor RT5 is provided between a node N14 of a base of the bipolar transistor BP3 and a node N15 of a collector. The resistor RT6 is provided between an emitter of the bipolar transistor BP3 and the GND node, and has a variable resistance value. For example, the resistance value of the resistor RT6 is variably controlled based on a control signal SCR from the control circuit 60.

In FIG. 8, the temperature sensor 71 includes a bipolar transistor BP4 whose collector is supplied with the current IE obtained by mirroring the reference current IRF, and resistors RT7 and RT8. The resistor RT7 is provided between a node N16 of a base of the bipolar transistor BP4 and a node N17 of a collector. The resistor RT8 is provided between an emitter of the bipolar transistor BP4 and the node N15 of the collector of the bipolar transistor BP3, and has a variable resistance value. For example, the resistance value of the resistor RT8 is variably controlled based on the control signal SCR from the control circuit 60.

In FIG. 8, the current flowing through the transistors TT2 and TT3, which are the current sources, is set to IE, and the resistance values of the resistors RT5, RT6, RT7, and RT8 are set to R5, R6, R7, and R8, respectively. The base-emitter voltages of the bipolar transistors BP3 and BP4 are set to VBE1 and VBE2. Thus, a voltage at the node N15 of the collector of the bipolar transistor BP3 is VTSA=VBE1+IE×(2×R6−R5). Therefore, the temperature detection voltage that is a voltage at a node N17 of the collector of the bipolar transistor BP4 is VTS=VBE2+IE×(R8−R7)+VTSA=VBE1+VBE2+IE×(2×R6+R8−R5−R7). Since the base-emitter voltages VBE1 and VBE2 have negative temperature characteristics, the temperature sensor 71 of FIG. 8 can output the temperature detection voltage VTS that changes according to a temperature of an environment. That is, an offset of the temperature detection voltage VTS can be adjusted by changing the resistance values of the resistors RT6 and RT8.

In FIG. 8, the temperature sensor 71 includes the transistor TT3, the bipolar transistor BP4, and the resistors RT7 and RT8, and may have a configuration that does not include the transistor TT3, the bipolar transistor BP4, and the resistors RT7 and RT8. In this case, the voltage VTSA at the node N15 of the collector of the bipolar transistor BP3 may be output as the temperature detection voltage.

As described above, the temperature sensor 71 according to the embodiment includes the bipolar transistor BP3 whose collector is supplied with the current IE obtained by mirroring the reference current IRF, the resistor RT5 provided between the base and the collector of the bipolar transistor BP3, and the resistor RT6 provided between the emitter of the bipolar transistor BP3 and the GND node and having the variable resistance value. The bipolar transistor BP3 is a first bipolar transistor, the resistor RT5 is a first resistor, and the resistor RT6 is a second resistor. By using the base-emitter voltage VBE1 of the bipolar transistor BP3 or the like in this manner, the temperature detection voltage VTS that changes according to a temperature of an environment can be output. As described above, the temperature detection voltage VTS changes according to the current IE obtained by mirroring the reference current IRF. Accordingly, as the reference current IRF changes when the power supply voltage VDDL increases in the first mode to be higher than that of the second mode, the current IE obtained by mirroring the reference current IRF also changes, and the temperature detection voltage VTS also changes. In this regards, in the embodiment, even when the power supply voltage VDDL increases in the first mode, the reference current IRF supplied to the temperature sensor 71 based on the power supply voltage VDDL is controlled so as not to change. Accordingly, the noise reduction due to the first mode can be implemented, and the decrease in the accuracy of the temperature detection due to the change in the power supply voltage VDDL can also be prevented.

3. Oscillation Circuit and Waveform Shaping Circuit

Figure 9:
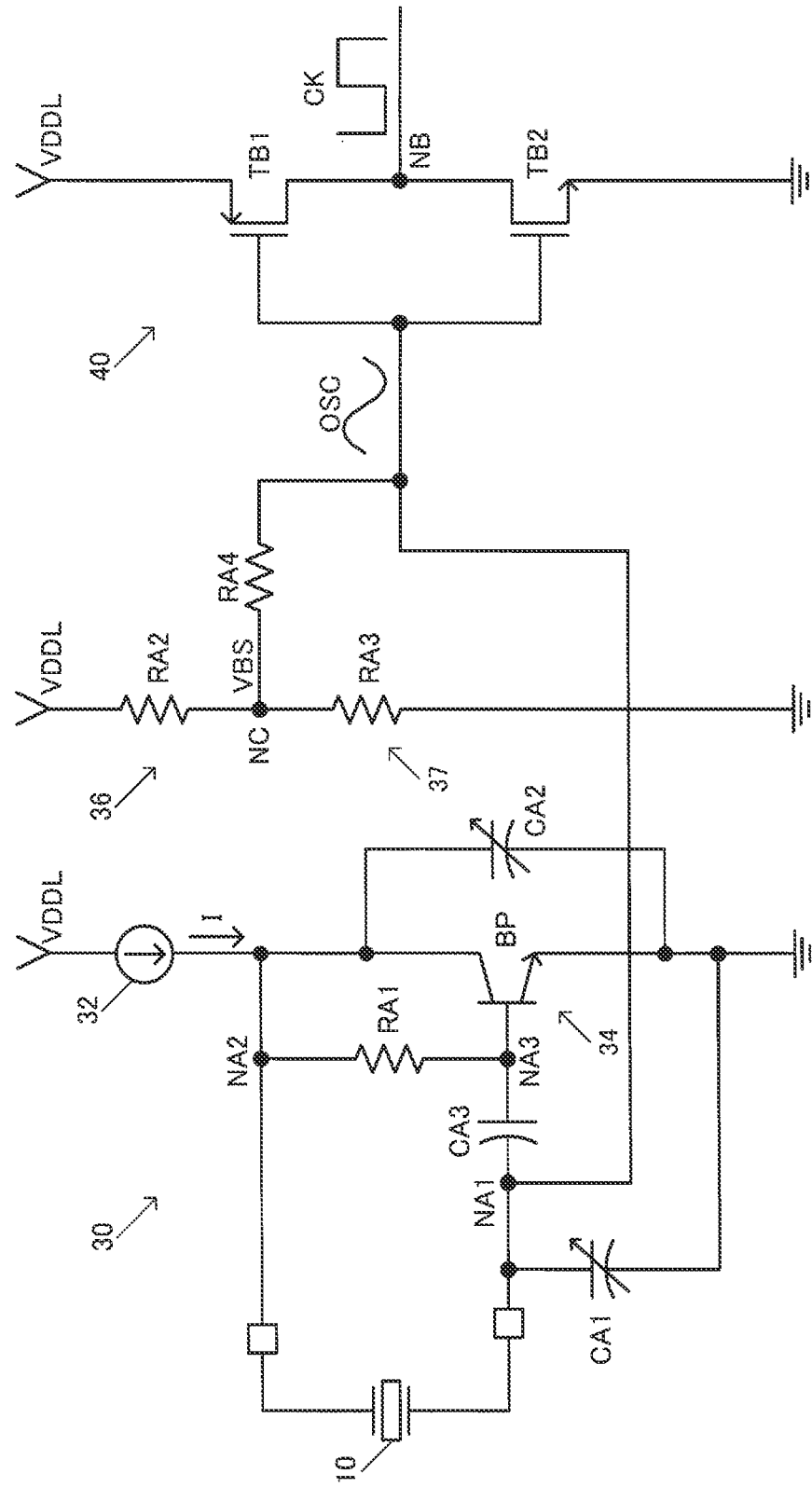
FIG. 9 shows a configuration example of an oscillation circuit and a waveform shaping circuit.

FIG. 9 shows a configuration example of the oscillation circuit 30 and the waveform shaping circuit 40. The oscillation circuit 30 and the waveform shaping circuit 40 are not limited to the configuration in FIG. 9, and various modifications can be made, such as omitting a part of components, adding other components, or replacing a part of components with other components.

The oscillation circuit 30 includes a current source 32 and the drive circuit 34. The oscillation circuit 30 may include variable capacitance circuits CA1 and CA2, a capacitor CA3, and a resistor RA1.

The current source 32 and the drive circuit 34 are provided in series between a VDDL power supply node, which is a high-potential-side power supply node, and a GND node, which is a low-potential-side power supply node. The variable capacitance circuit CA1 is provided between a node NA1 to which one end of the resonator 10 is coupled and the GND node. The variable capacitance circuit CA2 is provided between a node NA2 to which the other one end of the resonator 10 is coupled and the GND node. By adjusting capacitances of the variable capacitance circuits CAL and CA2, the oscillation frequency is adjusted, and a process of the temperature compensation performed on the oscillation frequency is implemented.

The drive circuit 34 includes a bipolar transistor BP. A collector of the bipolar transistor BP is coupled to a node NA2 which is a supply node of a current I of the current source 32, and an emitter is coupled to the GND node. A resistor RA1 is provided between the collector and a base. The capacitor CA3 is provided between a node NA3 of the base of the bipolar transistor BP and the node NA1. The capacitor CA3 is, for example, a DC-cut capacitor.

The current source 32 can be implemented by, for example, the current mirror circuit. The current mirror circuit supplies, to the drive circuit 34, the current I obtained by current-mirroring the reference current from the reference current generation circuit 38. The drive circuit 34 drives the resonator 10 based on the current I from the current source 32. The current source 32 is, for example, a variable current source, and supplies the variable current I to the drive circuit 34. The bipolar transistor BP of the drive circuit 34 drives the resonator 10 based on the variable current I. The current source 32 supplies, to the drive circuit 34, the current I larger than that in the second mode, in the first mode which is the low noise mode. Accordingly, the floor noise to be described later in the oscillation circuit 30 can be reduced, and the phase noise of the output clock signal CKQ can be reduced. On the other hand, the current source 32 supplies, to the drive circuit 34, the current I smaller than that in the first mode, in the second mode which is the low power consumption mode. Accordingly, the power consumption of the oscillation circuit 30 is reduced, and the power consumption of the circuit device 20 can be reduced.

The waveform shaping circuit 40 includes a P-type transistor TB1 and an N-type transistor TB2 that are provided in series between the VDDL power supply node, which is the high-potential-side power supply node, and the GND node. For example, a source of the transistor TB1 is coupled to the power supply node, and a source of the transistor TB2 is coupled to the GND node. Drains of the transistors TB1 and TB2 are coupled to a coupling node NB from which the clock signal CK is output. When the second power supply voltage VDDL2 is supplied to the waveform shaping circuit 40 as shown in FIG. 3, the power supply node is a VDDL2 node. The same applies to the following description. The oscillation signal OSC is input to gates of the transistors TB1 and TB2, and the sine wave oscillation signal OSC is subjected to the waveform shaping to obtain the rectangular wave clock signal CK by the buffer circuit of the waveform shaping circuit 40 including the transistors TB1 and TB2.

In FIG. 9, the reference voltage generation circuit 36 is provided. The reference voltage generation circuit 36 includes the ladder resistance circuit 37, and the ladder resistance circuit 37 includes a plurality of resistors RA2 and RA3 provided in series between the power supply node and the GND node. The bias voltage VBS is generated at a node NC by voltage division due to the resistors RA2 and RA3. For example, the bias voltage is set to VBS=VDDL/2. The reference voltage generation circuit 36 includes a resistor RA4 having one end coupled to the node NC which is a voltage division node. The bias voltage VBS of the oscillation signal OSC input to the waveform shaping circuit 40 is set by the reference voltage generation circuit 36, and the oscillation signal OSC whose center amplitude voltage is set to the bias voltage VBS is input to the waveform shaping circuit 40.

A DC-cut capacitor may be provided between a node of the gates of the transistors TB1 and TB2 of the waveform shaping circuit 40 and an input node of the oscillation signal OSC. In this manner, an AC component of the oscillation signal OSC is input to the waveform shaping circuit 40. In this case, for example, a feedback resistor that feeds back an output of the waveform shaping circuit 40 to an input may be provided, and the bias voltage by self-bias of the waveform shaping circuit 40 may be set to the center amplitude voltage of the oscillation signal OSC after the DC cut.

In FIG. 9, floor noise SWPM in the oscillation circuit 30 is expressed by the following Equation (1).

$$SWPM = 2FkT/PS \quad (1)$$

F is a noise coefficient, k is a Boltzmann constant, and T is a temperature. PS is input power of the drive circuit 34 (bipolar transistor BP) of the oscillation circuit 30, and correlates with the amplitude of the oscillation signal OSC. For example, when the current I supplied to the drive circuit 34 of the oscillation circuit 30 in the first mode is set to be larger than that in the second mode, the input power PS is increased as shown in the above Equation (1), so that SWPM which is the floor noise in the oscillation circuit 30 can be reduced. Accordingly, the phase noise of the clock signal CK can be reduced, and the phase noise of the output clock signal CKQ can be reduced.

For example, the phase noise of the clock signal CK in the waveform shaping circuit 40 is generated due to the floor noise in the oscillation circuit 30, the noise of the power supply voltage VDDL, the noise generated by the transistors TB1 and TB2 of the waveform shaping circuit 40, and the like. For example, FIG. 10 is a diagram showing conversion from a voltage noise to the phase noise at the time of the waveform shaping performed by the waveform shaping circuit 40. As shown in FIG. 10, when a driving capability of the waveform shaping circuit 40 is low, voltage noise indicated by A1 is converted into large phase noise as indicated by A2. On the other hand, when the driving capability of the waveform shaping circuit 40 is high, phase noise indicated by A4 converted from the voltage noise indicated by A3 is smaller than the phase noise indicated by A2 when the driving capability is low. The voltage noise of A1 and A3 is, for example, noise caused by power supply noise or noise of the transistors TB1 and TB2, and the floor noise in the waveform shaping circuit 40 is converted into phase noise before being input to the waveform shaping circuit 40.

In this manner, by improving the driving capability of the waveform shaping circuit 40 in the first mode, it is possible to reduce the phase noise caused by voltage noise or the like, and it is possible to implement the first mode which is the low noise mode.

Figure 11:
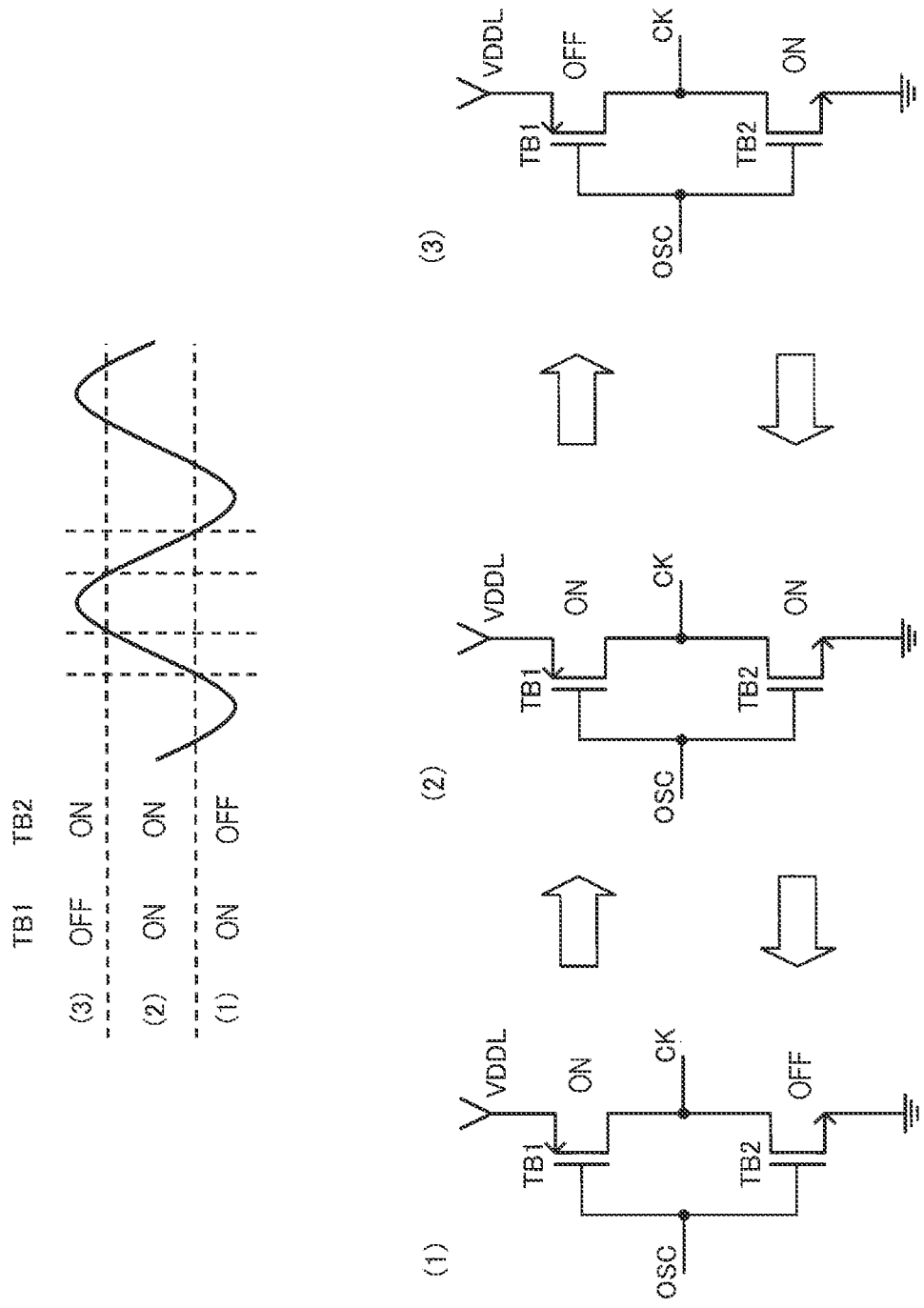
FIG. 11 is a diagram showing on and off states of a transistor in the waveform shaping circuit.

For example, FIG. 11 is a diagram showing a relationship between a voltage level of the oscillation signal OSC and on and off states of the transistors TB1 and TB2 of the waveform shaping circuit 40. When the voltage level of the oscillation signal OSC is in a voltage range of (1) in FIG. 11, the P-type transistor TB1 is turned on, and the N-type transistor TB2 is turned off. Further, when the voltage level of the oscillation signal OSC is in a voltage range of (2), both the P-type transistor TB1 and the N-type transistor TB2 are turned on. Further, when the voltage level of the oscillation signal OSC is in a voltage range of (3), the P-type transistor TB1 is turned off, and the N-type transistor TB2 is turned on. In a period in which both the transistors TB1 and TB2 are turned on as shown in (2) of FIG. 11, a through current flows from the power supply node to the GND node, and noise from the power supply is propagated as the phase noise. For example, when a through current exceeding a current supply capacity of the power supply circuit 90 flows, an effect of reducing the power supply noise caused by the regulator of the power supply circuit 90 is lost, and the power supply noise is propagated as the phase noise instead of being reduced.

In this regard, in the embodiment, the driving capability of the waveform shaping circuit 40 is improved in the first mode. In this manner, the period during which both the transistors TB1 and TB2 are turned on as in (2) of FIG. 11 can be shortened in time. By shortening the period during which both the transistors TB1 and TB2 are turned on in this manner, it is possible to reduce the phase noise caused by the power supply noise, and it is possible to implement the noise reduction of the output clock signal CKQ.

Figure 12:
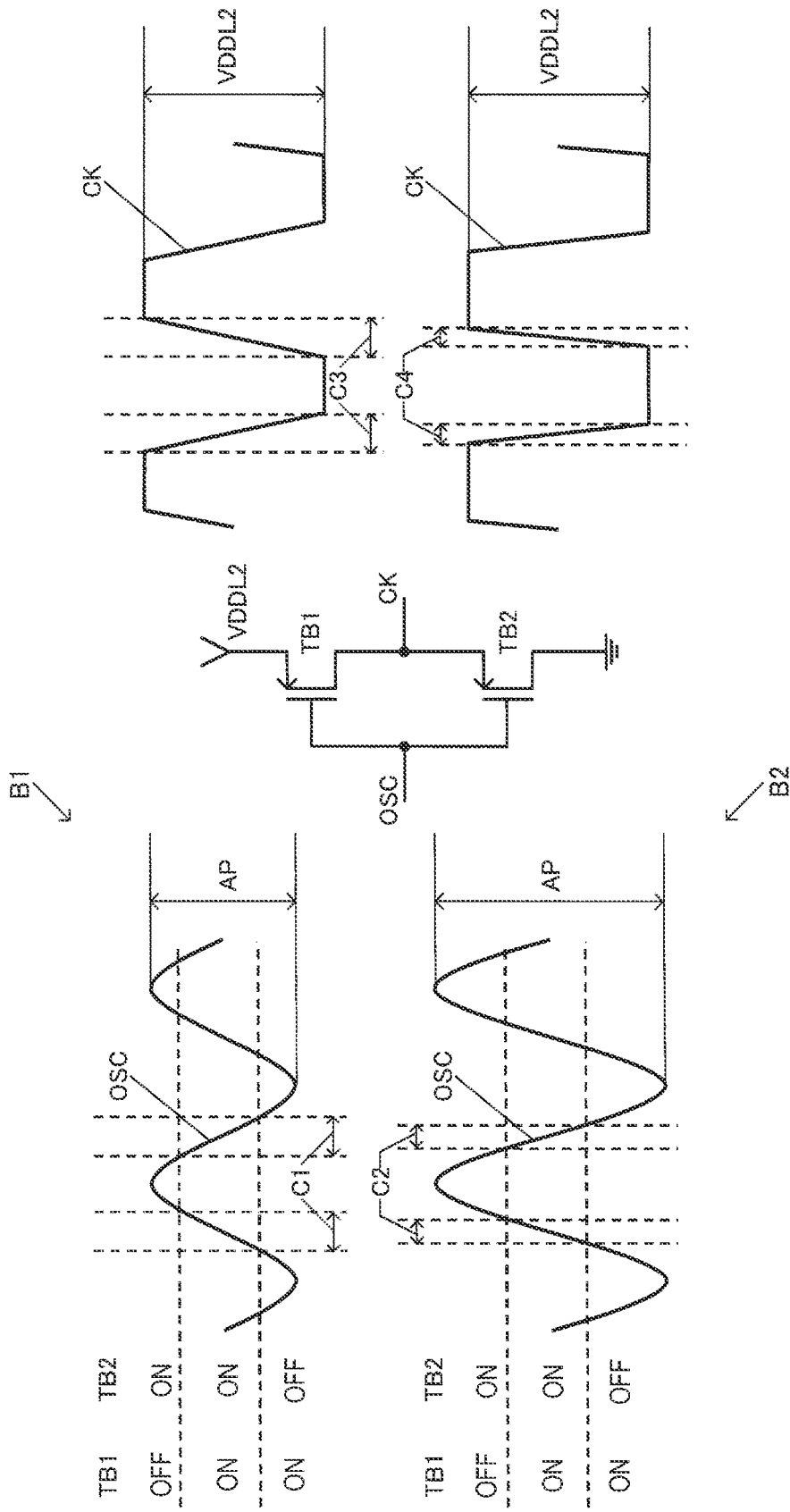
FIG. 12 is a diagram showing a method of differentiating an oscillation amplitude and a power supply voltage of the waveform shaping circuit.

FIG. 12 is a diagram showing a method of differentiating the first power supply voltage VDDL1 supplied to the oscillation circuit 30 and the second power supply voltage VDDL2 supplied to the waveform shaping circuit 40 as shown in FIG. 3. In B2 of FIG. 12, an amplitude AP of the oscillation signal OSC is larger than that in B1. For example, the amplitude AP is increased to be larger than the second power supply voltage VDDL2 of the waveform shaping circuit 40. That is, a peak-to-peak voltage of the oscillation signal OSC is increased to be larger than the second power supply voltage VDDL2. For example, the amplitude AP of the oscillation signal OSC can be increased by increasing the first power supply voltage VDDL1 supplied to the oscillation circuit 30. By increasing the amplitude AP in this manner, it is possible to shorten the period in which both the transistors TB1 and TB2 of the waveform shaping circuit 40 are turned on as indicated by C2, as compared with a case in which the amplitude AP indicated by C1 is small. Even in a transition period in which the clock signal CK transitions from an L level to an H level or from the H level to the L level, the transition period is shortened as indicated by C4 by increasing the amplitude AP as compared with C3 of a case in which the amplitude AP is small. By shortening the periods indicated by C2 and C4, as in the case of FIG. 10, it is possible to reduce the phase noise caused by the power supply noise, and it is possible to implement the noise reduction of the output clock signal CKQ.

As described above, in the embodiment, the driving capability of the waveform shaping circuit 40 in the first mode is higher than the driving capability of the waveform shaping circuit 40 in the second mode. For example, in the first mode, the driving capability of the waveform shaping circuit 40 is increased by setting sizes of the transistors TB1 and TB2 of the waveform shaping circuit 40 to be larger than that in the second mode, or by increasing the power supply voltage VDDL or the second power supply voltage VDDL2 supplied to the waveform shaping circuit 40. By increasing the driving capability of the waveform shaping circuit 40 in the first mode in this manner, it is possible to reduce the phase noise of the clock signal CK caused by the power supply noise, the noise of the transistor, and the like as described in FIG. 10 and the like, and it is possible to output the output clock signal CKQ in which the phase noise is reduced.

In the embodiment, the power supply voltage VDDL supplied to the waveform shaping circuit 40 in the first mode is larger than the power supply voltage VDDL supplied to the waveform shaping circuit 40 in the second mode. By increasing the power supply voltage VDDL supplied to the waveform shaping circuit 40 in the first mode in this manner, the driving capability of the waveform shaping circuit 40 in the first mode can be increased. Accordingly, it is possible to shorten the period during which both the transistors TB1 and TB2 of the waveform shaping circuit 40 are turned on in FIG. 11, it is possible to reduce the phase noise of the clock signal CK caused by the power supply noise and the noise of the transistors, and it is possible to implement the first mode which is the low noise mode. When the power supply voltages of the oscillation circuit 30 and the waveform shaping circuit 40 are made different from each other as shown in FIG. 3, the second power supply voltage VDDL2 supplied to the waveform shaping circuit 40 in the first mode may be made higher than that in the second mode.

In the embodiment, the power supply voltage VDDL supplied to the oscillation circuit 30 in the first mode is larger than the power supply voltage VDDL supplied to the oscillation circuit 30 in the second mode. By increasing the power supply voltage VDDL of the oscillation circuit 30 in the first mode in this manner, an amplitude of the oscillation signal OSC can be increased, and noise reduction can be implemented. For example, by increasing the amplitude of the oscillation signal OSC, it is possible to shorten the period during which both the transistors TB1 and TB2 of the waveform shaping circuit 40 described in FIG. 12 are turned on, and it is possible to reduce the phase noise caused by power supply noise or the like. Further, by increasing the amplitude of the oscillation signal OSC, an influence of floor noise can be reduced, and the first mode which is the low noise mode can be implemented.

In the embodiment, as shown in FIG. 9, the oscillation circuit 30 includes the current source 32 and the drive circuit 34 to which the current I from the current source 32 is supplied to drive the resonator 10. The current I supplied from the current source 32 to the drive circuit 34 in the first mode is larger than the current I supplied from the current source 32 to the drive circuit 34 in the second mode. For example, the current source 32 can be implemented by the current mirror circuit that supplies the current I obtained by current-mirroring the reference current. In the first mode, the current I supplied from the current source 32 is increased by increasing the reference current or increasing a current mirror ratio as compared with the second mode. By increasing the current supplied from the current source 32 to the drive circuit 34 in the first mode in this manner, the input power PS to the drive circuit 34 can be increased as described in the above Equation (1), and the floor noise in the oscillation circuit 30 can be reduced. By reducing the floor noise of the oscillation circuit 30, the noise of the oscillation signal OSC is reduced, the phase noise of the clock signal CK and the output clock signal CKQ generated based on the oscillation signal OSC can be reduced, and the first mode which is the low noise mode can be implemented.

In the embodiment, as shown in FIG. 3, the oscillation circuit 30 operates by being supplied with the first power supply voltage VDDL1, and the waveform shaping circuit 40 operates by being supplied with the second power supply voltage VDDL2 different from the first power supply voltage VDDL1. For example, the first power supply voltage VDDL1 and the second power supply voltage VDDL2 can be adjusted separately. For example, the regulators 91 and 92 in FIG. 3 include an operational amplifier whose first input terminal receives the reference voltage and which controls a gate of a drive transistor, and a resistance division circuit provided between a node of a drain of the drive transistor and the GND node. A division voltage of an output voltage of the drive transistor from the resistance division circuit is fed back to a second input terminal of the operational amplifier. By adjusting a resistance ratio of the resistance division voltage, the voltage of the first power supply voltage VDDL1 output from the regulator 91 and the voltage of the second power supply voltage VDDL2 output from the regulator 92 can be adjusted. Since the first power supply voltage VDDL1 supplied to the oscillation circuit 30 and the second power supply voltage VDDL2 supplied to the waveform shaping circuit 40 can be adjusted separately in this manner, it is possible to finely adjust the first mode which is the low noise mode and the second mode which is the low power consumption mode. For example, in the first mode, the first power supply voltage VDDL1 of the oscillation circuit 30 and the second power supply voltage VDDL2 of the waveform shaping circuit 40 are increased, but it is possible to adjust each voltage of the first power supply voltage VDDL1 and the second power supply voltage VDDL2 separately, so that the noise is reduced. In addition, in the second mode, the first power supply voltage VDDL1 of the oscillation circuit 30 and the second power supply voltage VDDL2 of the waveform shaping circuit 40 are decreased, but it is possible to adjust each voltage of the first power supply voltage VDDL1 and the second power supply voltage VDDL2 separately, so that the power consumption is reduced.

In the embodiment, the waveform shaping circuit 40 is supplied with the second power supply voltage VDDL2 smaller than the amplitude of the oscillation signal OSC and operates. That is, as described in FIG. 12, the second power supply voltage VDDL2 is adjusted, so that the second power supply voltage VDDL2 becomes smaller than the amplitude AP of the oscillation signal OSC. This adjustment can be implemented by adjusting the resistance ratio or the like of the resistance division circuit of the regulator 92. In this manner, the oscillation signal OSC having an amplitude larger than the second power supply voltage VDDL2 of the waveform shaping circuit 40 is input to the waveform shaping circuit 40, and the period during which both the transistors TB1 and TB2 of the waveform shaping circuit 40 are turned on can be shortened. Accordingly, the phase noise of the clock signal CK caused by the power supply noise or the like can be reduced, and the first mode which is the low noise mode can be implemented.

Figure 13:
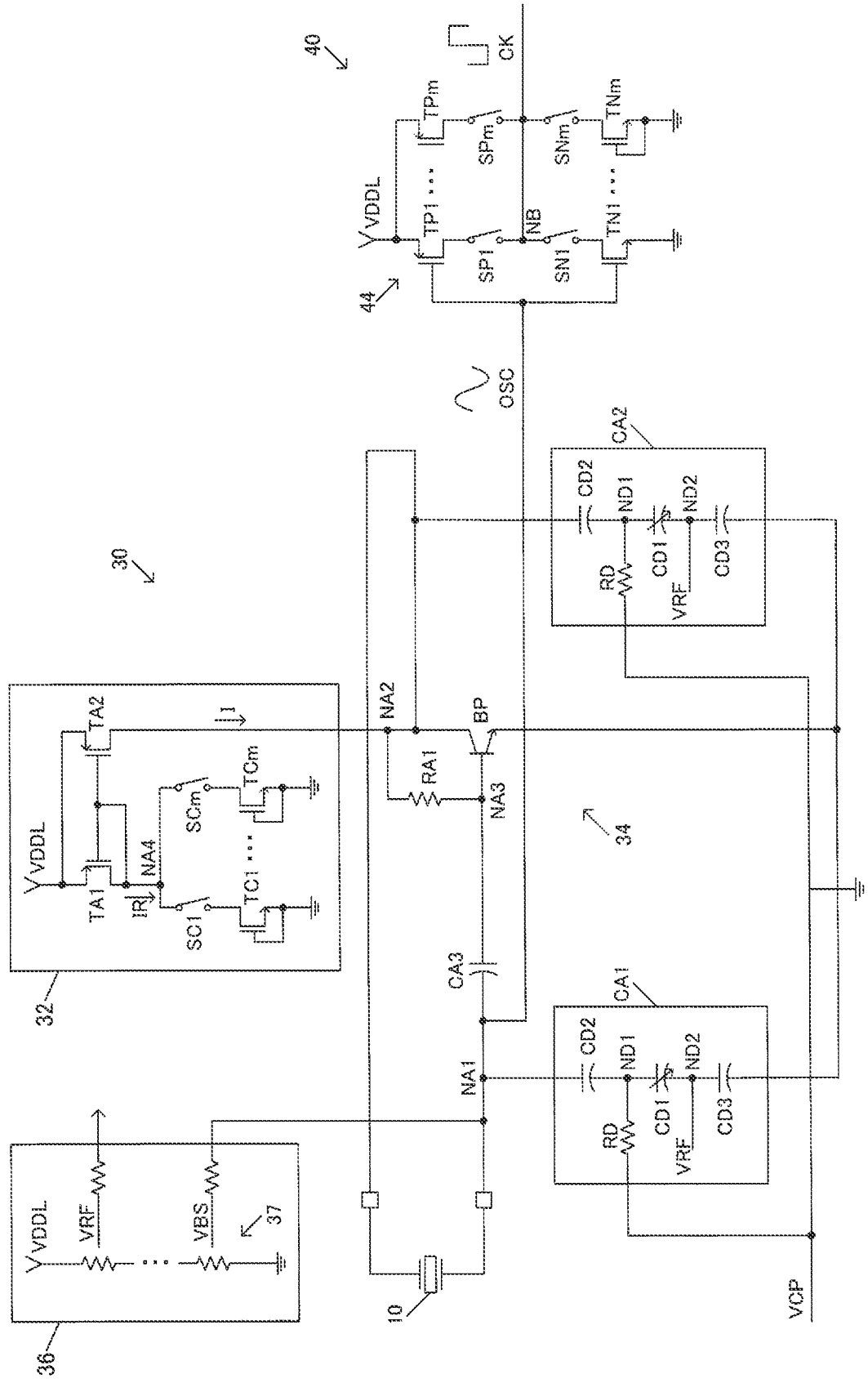
FIG. 13 shows a detailed configuration example of the oscillation circuit and the waveform shaping circuit.

FIG. 13 shows a detailed configuration example of the waveform shaping circuit 40 and the oscillation circuit 30. As shown in FIG. 13, the current source 32 of the oscillation circuit 30 includes a current mirror circuit including transistors TA1 and TA2. Sources of the P-type transistors TA1 and TA2 are coupled to the power supply node, and gates thereof are commonly coupled to a node NA4. The current I obtained by the current mirror circuit current-mirroring the reference current IR is supplied from the current source 32 to the drive circuit 34. For example, a plurality of switches SC1 to SCm and a plurality of transistors TC1 to TCm are provided between the node NA4 and the GND node, and the reference current IR is generated by the switches and the transistors. Here, m is an integer of 2 or more. The switches SC1 to SCm and the transistors TC1 to TCm are provided in series between the node NA4 and the GND node. The switches SC1 to SCm can be implemented by, for example, transistors that are turned on or off by a control signal from the control circuit 60. The transistors TC1 to TCm are implemented by, for example, N-type depletion type transistors, and gates and sources thereof are coupled. In the first mode, the number of switches SC1 to SCm to be turned on is larger than that in the second mode. In this manner, in the first mode, the reference current IR is larger than that in the second mode, and the current I supplied from the current source 32 to the drive circuit 34 is also increased. Accordingly, the first mode, which is the low noise mode, can be implemented. On the other hand, in the second mode, the number of the switches SC1 to SCm to be turned on is smaller than that in the second mode, and accordingly, the second mode, which is the low power consumption mode, can be implemented.

Each of the variable capacitance circuits CA1 and CA2 includes a variable capacitance element CD1, capacitors CD2 and CD3, and a resistor RD. The capacitor CD2 has one end coupled to the node NA1 or the node NA2 and the other end coupled to a node ND1. The temperature compensation voltage VCP from the temperature compensation circuit 70 of FIGS. 2 and 3 is supplied to the node ND1 via the resistor RD. The variable capacitance element CD1 has one end coupled to the node ND1 and the other end coupled to a node ND2. The reference voltage VRF from the reference voltage generation circuit 36 is supplied to the node ND2. The capacitor CD3 is provided between the node ND2 and the GND node. Capacitances of the variable capacitance elements CD1 of the variable capacitance circuits CA1 and CA2 are adjusted by the temperature compensation voltage VCP, thereby implementing the process of the temperature compensation.

The waveform shaping circuit 40 includes a buffer circuit 44. The buffer circuit 44 performs the waveform shaping on the input oscillation signal OSC and outputs the clock signal CK. The buffer circuit 44 includes a plurality of P-type transistors TP1 to TPm and a plurality of P-side switches SP1 to SPm. The plurality of P-type transistors TP1 to TPm and the plurality of P-side switches SP1 to SPm are coupled in series between the power supply node and the coupling node NB. The buffer circuit 44 further includes a plurality of N-type transistors TN1 to TNm and a plurality of N-side switches SN1 to SNm. The plurality of N-type transistors TN1 to TNm and the plurality of the N-side switches SN1 to SNm are coupled in series between the coupling node NB and the GND node. The plurality of P-type transistors TP1 to TPm correspond to the P-type transistor TB1 in FIG. 4, and the plurality of N-type transistors TN1 to TNm correspond to the N-type transistor TB2. That is, each of the transistors TB1 and TB2 of the waveform shaping circuit 40 is divided into a plurality of unit transistors.

In the embodiment, the number of the P-side switches SP1 to SPm and the N-side switches SN1 to SNm that are turned on in the first mode is larger than the number of the P-side switches SP1 to SPm and the N-side switches SN1 to SNm that are turned on in the second mode. For example, the switches SP1 to SPm and SN1 to SNm are turned on and off based on a control signal from the control circuit 60, and are controlled such that the number of switches that are turned on in the first mode is larger than that in the second mode. In this manner, the number of P-type transistors coupled in parallel between the power supply node and the coupling node NB and the number of N-type transistors coupled in parallel between the coupling node NB and the GND node in the first mode are controlled to be larger than that in the second mode. That is, the resistances of the transistors TB1 and TB2 in FIG. 4 can be reduced in the first mode. Accordingly, the driving capability of the waveform shaping circuit 40 in the first mode can be improved as compared with that in the second mode, and the phase noise caused by the power supply noise or the like can be reduced.

Figure 14:
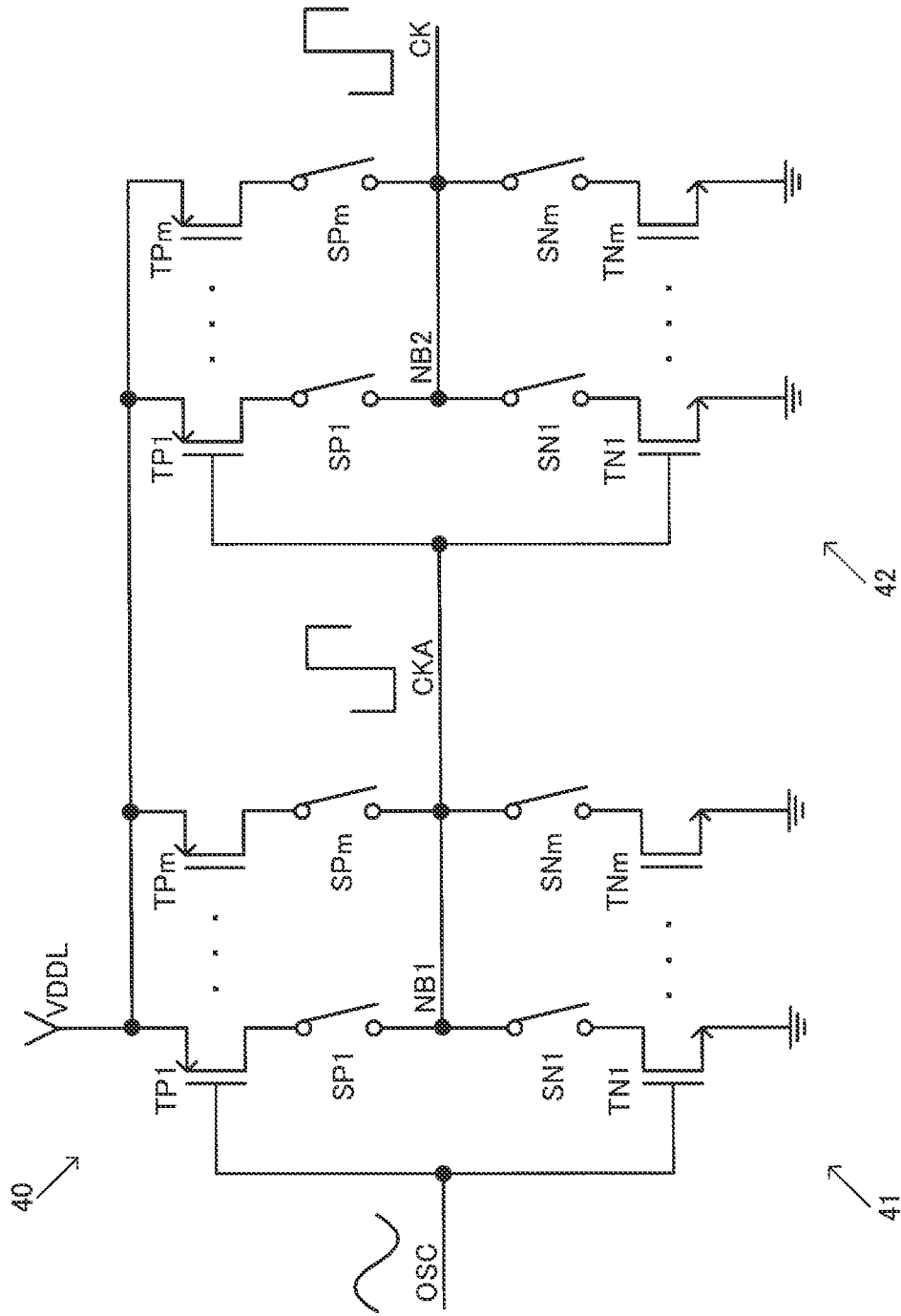
FIG. 14 shows another detailed configuration example of the waveform shaping circuit.

FIG. 14 shows another configuration example of the waveform shaping circuit 40. The waveform shaping circuit 40 of FIG. 14 includes a first buffer circuit 41 and a second buffer circuit 42 provided at a stage subsequent to the first buffer circuit 41. For example, the oscillation signal OSC is input to the first buffer circuit 41, and a signal CKA subjected to the waveform shaping performed by the first buffer circuit 41 is input to the second buffer circuit 42. The signal subjected to the waveform shaping performed by the second buffer circuit 42 is output as the clock signal CK. In this manner, in FIG. 14, the waveform shaping is performed by a plurality of buffer circuits. The number of buffer circuits in the waveform shaping circuit 40 may be three or more.

In FIG. 14, each of the first buffer circuit 41 and the second buffer circuit 42 includes the plurality of P-type transistors TP1 to TPm and the plurality of P-side switches SP1 to SPm. The plurality of P-type transistors TP1 to TPm and the plurality of P-side switches SP1 to SPm are coupled in series between the power supply node and the coupling node NB1 or NB2. Each buffer circuit further includes a plurality of N-type transistors TN1 to TNm and a plurality of N-side switches SN1 to SNm. The plurality of N-type transistors TN1 to TNm and the plurality of the N-side switches SN1 to SNm are coupled in series between the coupling node NB1 or NB2 and the GND node.

In each of the first buffer circuit 41 and the second buffer circuit 42, the number of the P-side switches SP1 to SPm and the N-side switches SN1 to SNm that are turned on in the first mode is larger than the number of the P-side switches SP1 to SPm and the N-side switches SN1 to SNm that are turned on in the second mode. In this manner, in each buffer circuit, the number of P-type transistors coupled in parallel between the power supply node and the coupling node NB1 or NB2 and the number of N-type transistors coupled in parallel between the coupling node NB1 or NB2 and the GND node in the first mode are controlled to be larger than that in the second mode. Accordingly, the driving capability of each buffer circuit of the waveform shaping circuit 40 in the first mode can be improved as compared with that in the second mode, and the phase noise caused by the power supply noise or the like can be reduced. As shown in FIG. 14, a plurality of buffer circuits such as the first buffer circuit 41 and the second buffer circuit 42 are provided, so that the driving capability of each buffer circuit of the plurality of buffer circuits can be adjusted, and it is possible to adjust a balance between the noise reduction and the low power consumption. In this case, the driving capabilities of the plurality of buffer circuits may be individually switched or may be switched in conjunction with each other. That is, as the on and off control signals of the switches SP1 to SPm and the switches SN1 to SNm of the first buffer circuit 41 and the second buffer circuit 42, individual control signals may be used or a common control signal may be used.

4. Adjustment of Driving Capability of Output Circuit

Figure 15:
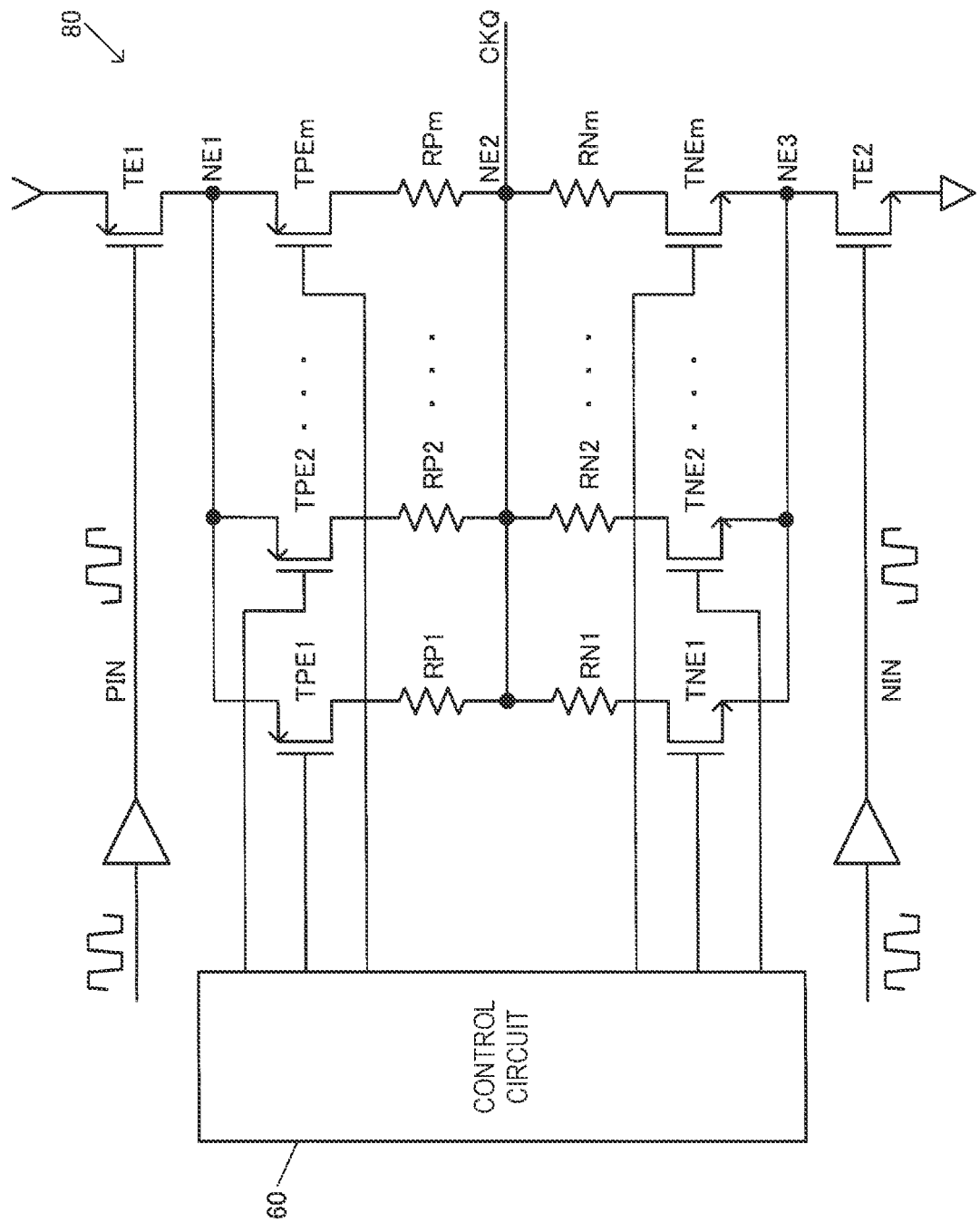
FIG. 15 shows a configuration example of an output circuit.

As described above, in the embodiment, the first mode and the second mode are implemented by adjusting the power supply voltage VDDL, adjusting the driving capability of the waveform shaping circuit 40, and the like. In this case, in addition to the above adjustment, the driving capability of the output circuit 80 may be adjusted. FIG. 15 shows a configuration example of the output circuit 80 capable of adjusting the driving capability as described above. In FIG. 15, the driving capability of the output circuit 80 in the first mode, which is the low noise mode, is higher than the driving capability of the output circuit 80 in the second mode.

Specifically, the output circuit 80 of FIG. 15 includes a transistor TE1, transistors TPE1 to TPEm, transistors TNE1 to TNam, and a transistor TE2. The TEL and TPE1 to TPEm are, for example, the P-type transistors, and the TNE1 to TNEm and TE2 are, for example, the N-type transistors. The output circuit 80 includes P-side resistors RP1 to RPm and N-side resistors RN1 to RNm. The resistors RP1 to RPm and RN1 to RNm can also serve as, for example, a resistor for electrostatic protection of the output circuit 80.

A source of the transistor TEL is coupled to the power supply node, and a P-side signal PIN based on the clock signal CK or the clock signal CKD is input to a gate of the transistor TE1. The transistors TPE1 to TPEm and the resistors RP1 to RPm are provided between a node NEL of a drain of the transistor TE1 and a node NE2 of an output of the output circuit 80. The transistors TPE1 to TPEm and the resistors RP1 to RPm are provided in series between the nodes NE1 and NE2. In addition, a control signal from the control circuit 60 is input to the gates of the transistors TPE1 to TPEm, and on and off of the transistors TPE to TPEm are controlled.

A source of the transistor TE2 is coupled to the GND node, and a N-side signal NIN based on the clock signal CK or the clock signal CKD is input to a gate of the transistor TE2. The resistors RN1 to RNm and the transistors TNE1 to TNEm are provided between the node NE2 and a node NE3 of a drain of the transistor TE2. The resistors RN1 to RNm and the transistors TNE1 to TNlm are provided in series between the node NE2 and the node NE3. In addition, a control signal from the control circuit 60 is input to the gates of the transistors TNE1 to TNEm, and on and off of the transistors TNE1 to TNEm are controlled.

In the embodiment, the number of the transistors TPE1 to TPEm and the number of the transistors TNE1 to TNEm that are turned on in the first mode are larger than the number of the transistors TPE1 to TPEm and the number of the transistors TNE1 to TNEm that are turned on in the second mode. As described above, in the first mode, since the number of transistors that are turned on is increased, a larger number of resistors among the resistors RP1 to RPm and RN1 to RNm are coupled in parallel, and it is possible to reduce a resistance value between the node NE1 and the node NE2 and a resistance value between the node NE2 and the node NE3. Accordingly, in the first mode, the driving capability of the output circuit 80 is improved as compared with that in the second mode, and a slope of a waveform of the output clock signal CKQ when an external load is driven becomes steeper and approaches vertical. Accordingly, for the same reason as in the case of FIG. 10, the phase noise of the output clock signal CKQ caused by the power supply noise or the like can be reduced, and the first mode which is the low noise mode can be implemented. On the other hand, in the second mode, as the number of transistors that are turned on decreases, the driving capability of the output circuit 80 decreases, and the slope of the waveform of the output clock signal CKQ decreases and becomes flat. In this manner, by adjusting the driving capability of the output circuit 80 in addition to the power supply voltage VDDL and the driving capability of the waveform shaping circuit 40, it is possible to further adjust the noise reduction and the low power consumption.

In FIG. 15, the driving capability is adjusted by changing a size of a transistor of an output stage of the output circuit 80, but the driving capability may be adjusted by changing the power supply voltage supplied to the output circuit 80. In FIG. 15, the P-type transistor is used as the transistor TE1 to which the signal PIN is input, but the N-type transistor may also be used. For example, when the output clock signal CKQ is output as a differential clock signal, an output of an open drain may be performed using the N-type transistor as the transistor TE1.

As described above, a circuit device according to the embodiment is configured to switching between a first mode in which phase noise of an output clock signal is lower than that in a second mode and the second mode in which power consumption is smaller than that in the first mode. The circuit device includes: an oscillation circuit configured to generate an oscillation signal; an output circuit configured to output the output clock signal based on the oscillation signal; a temperature sensor configured to output a temperature detection signal; a temperature compensation circuit configured to perform temperature compensation on an oscillation frequency of the oscillation circuit based on the temperature detection signal; and a control circuit. The control circuit performs control such that a power supply voltage supplied to the oscillation circuit in the first mode is higher than a power supply voltage supplied to the oscillation circuit in the second mode. In addition, the control circuit performs control such that at least one of a reference voltage supplied to the temperature compensation circuit based on the power supply voltage and a reference current supplied to the temperature sensor based on the power supply voltage does not change between the first mode and the second mode.

In the embodiment, the circuit device can perform switching between the first mode with low phase noise and the second mode with low power consumption. In the embodiment, when the oscillation signal is generated and the output clock signal based on the oscillation signal is output, the temperature compensation is performed on the oscillation frequency based on the temperature detection signal. In the first mode, the power supply voltage supplied to the oscillation circuit is controlled to be higher than that in the second mode, and at least one of the reference voltage supplied to the temperature compensation circuit and the reference current supplied to the temperature sensor is controlled not to change between the first mode and the second mode. By increasing the power supply voltage supplied to the oscillation circuit in the first mode in this manner, the first mode which is the low noise mode can be implemented. Even if the power supply voltage increases in the first mode, the reference voltage and the reference current are controlled so as not to change, and thus, adverse influences caused by changes in the reference voltage and the reference current can be reduced. Accordingly, it is possible to prevent the decrease in the accuracy of the temperature compensation and the like while implementing the noise reduction.

Further, in the embodiment, a reference voltage generation circuit configured to generate the reference voltage based on the power supply voltage and supply the reference voltage to the temperature compensation circuit may be provided, and the reference voltage generation circuit may supply the reference voltage to the temperature compensation circuit, the reference voltage being controlled such that the voltage does not change between the first mode and the second mode.

In this manner, even when the power supply voltage supplied to the oscillation circuit increases in the first mode, the reference voltage controlled so as not to change between the first mode and the second mode is supplied from the reference voltage generation circuit to the temperature compensation circuit, and it is possible to prevent the accuracy of the temperature compensation from being decreased due to the change in the power supply voltage.

In the embodiment, the reference voltage generation circuit may include a plurality of resistors provided in series between a power supply node to which the power supply voltage is supplied and a GND node, and a switch provided in parallel with one resistor of the plurality of resistors. The switch may be turned off in the first mode, and the switch may be turned on in the second mode.

In this manner, in the second mode, by turning on the switch, both ends of the resistor provided in parallel with the switch are bypassed by the switch, and in the first mode, by turning off the switch, both ends of the resistor are not bypassed. Accordingly, even when the power supply voltage increases in the first mode, it is possible to perform control such that the reference voltage does not change between the first mode and the second mode.

Further, in the embodiment, $R1=(V1-V2)/IA$ may be satisfied, in which a current flowing through the plurality of resistors is set to IA, the power supply voltage in the first mode is set to V1, the power supply voltage in the second mode is set to V2, and a resistance value of the resistor provided in parallel with the switch is set to R1.

When the resistance value of the resistor provided in parallel with the switch SWT is set to $R1=(V1-V2)/IA$ in this manner, even when the power supply voltage in the first mode is set to a voltage higher than the power supply voltage in the second mode, the reference voltage can be controlled so as not to change.

Further, in the embodiment, a reference current generation circuit configured to generate the reference current based on the power supply voltage and supply the reference current to the temperature sensor may be provided, the reference current generation circuit may supply the reference current to the temperature sensor, the reference current being controlled such that the current does not change between the first mode and the second mode.

In this manner, even when the power supply voltage supplied to the oscillation circuit increases in the first mode, the reference current controlled so as not to change between the first mode and the second mode is supplied from the reference current generation circuit to the temperature sensor, and it is possible to prevent the accuracy of the temperature detection from being decreased due to the change in the power supply voltage.

In the embodiment, the reference current generation circuit may include a plurality of resistors and a bipolar transistor whose collector and base are coupled, which are provided in series between a power supply node to which the power supply voltage is supplied and a GND node, and a switch provided in parallel with one resistor of the plurality of resistors. The switch may be turned off in the first mode, and the switch may be turned on in the first mode.

In this manner, in the second mode, by turning on the switch, both ends of the resistor provided in parallel with the switch are bypassed by the switch, and in the first mode, by turning off the switch, both ends of the resistor are not bypassed. Accordingly, even when the power supply voltage increases in the first mode, it is possible to perform control such that the reference current does not change between the first mode and the second mode.

Further, in the embodiment, $R1=(V1-V2)/IRF$ may be satisfied, in which the reference current is set to IRF, the power supply voltage in the first mode is set to V1, the power supply voltage in the second mode is set to V2, and a resistance value of the resistor provided in parallel with the switch is set to R1.

When the resistance value of the resistor provided in parallel with the switch SWT is set to $R1=(V1-V2)/IRF$ in this manner, even when the power supply voltage in the first mode is set to a voltage higher than the power supply voltage in the second mode, the reference current can be controlled so as not to change.

Further, in the embodiment, the temperature sensor may include a first bipolar transistor whose collector is supplied with a current obtained by mirroring the reference current, a first resistor provided between a base and the collector of the first bipolar transistor, and a second resistor provided between an emitter of the first bipolar transistor and a GND node and having a variable resistance value.

By using the base-emitter voltage of the first bipolar transistor or the like in this manner, the temperature detection voltage that changes according to a temperature of an environment can be output.

An oscillator according to the embodiment is configured to switching between a first mode in which phase noise of an output clock signal is lower than that in a second mode and the second mode in which power consumption is smaller than that in the first mode. The oscillator includes a resonator and a circuit device. The circuit device includes: an oscillation circuit configured to oscillate the resonator to generate an oscillation signal; an output circuit configured to output the output clock signal based on the oscillation signal; a temperature sensor configured to output a temperature detection signal; a temperature compensation circuit configured to perform temperature compensation on an oscillation frequency of the oscillation circuit based on the temperature detection signal; and a control circuit. The control circuit performs control such that a power supply voltage supplied to the oscillation circuit in the first mode is higher than a power supply voltage supplied to the oscillation circuit in the second mode. In addition, the control circuit performs control such that at least one of a reference voltage supplied to the temperature compensation circuit based on the power supply voltage and a reference current supplied to the temperature sensor based on the power supply voltage does not change between the first mode and the second mode.

By increasing the power supply voltage supplied to the oscillation circuit in the first mode in this manner, the first mode which is the low noise mode can be implemented. Even if the power supply voltage increases in the first mode, the reference voltage and the reference current are controlled so as not to change, and thus, adverse influences caused by changes in the reference voltage and the reference current can be reduced. Accordingly, it is possible to prevent the decrease in the accuracy of the temperature compensation and the like while implementing the noise reduction.

Although the embodiment has been described in detail above, it can be easily understood by those skilled in the art that many modifications can be made without substantially departing from the novel matters and effects of the present disclosure. Accordingly, all such modifications are within the scope of the present disclosure. For example, a term described at least once together with a different term having a broader meaning or the same meaning in the description or the drawings can be replaced with the different term at any place in the description or the drawings. All combinations of the embodiment and the modifications are also included in the scope of the disclosure. The configurations, operations, and the like of the circuit device and the oscillator are not limited to those described in the embodiment, and various modifications can be made.

What is claimed is:

1. A circuit device configured to switching between a first mode in which phase noise of an output clock signal is lower than that in a second mode and the second mode in which power consumption is smaller than that in the first mode, the circuit device comprising:
    an oscillation circuit configured to generate an oscillation signal;
    an output circuit configured to output the output clock signal based on the oscillation signal;
    a temperature sensor configured to output a temperature detection signal;
    a temperature compensation circuit configured to perform temperature compensation on an oscillation frequency of the oscillation circuit based on the temperature detection signal; and
    a control circuit configured to perform control such that a power supply voltage supplied to the oscillation circuit in the first mode is higher than a power supply voltage supplied to the oscillation circuit in the second mode, and perform control such that at least one of a reference voltage supplied to the temperature compensation circuit based on the power supply voltage and a reference current supplied to the temperature sensor based on the power supply voltage does not change between the first mode and the second mode.

2. The circuit device according to claim 1, further comprising:
    a reference voltage generation circuit configured to generate the reference voltage based on the power supply voltage and supply the reference voltage to the temperature compensation circuit, wherein
    the reference voltage generation circuit supplies the reference voltage to the temperature compensation circuit, the reference voltage being controlled such that the voltage does not change between the first mode and the second mode.

3. The circuit device according to claim 2, wherein
    the reference voltage generation circuit includes
    a plurality of resistors provided in series between a power supply node to which the power supply voltage is supplied and a GND node, and
    a switch provided in parallel with one resistor of the plurality of resistors, and
    the switch is turned off in the first mode, and the switch is turned on in the second mode.

4. The circuit device according to claim 3, wherein
    $R1=(V1-V2)/IA$ is satisfied, in which a current flowing through the plurality of resistors is set to IA, the power supply voltage in the first mode is set to V1, the power supply voltage in the second mode is set to V2, and a resistance value of the resistor provided in parallel with the switch is set to R1.

5. The circuit device according to claim 1, further comprising:
    a reference current generation circuit configured to generate the reference current based on the power supply voltage and supply the reference current to the temperature sensor, wherein
    the reference current generation circuit supplies the reference current to the temperature sensor, the reference current being controlled such that the current does not change between the first mode and the second mode.

6. The circuit device according to claim 5, wherein
    the reference current generation circuit includes
    a plurality of resistors and a bipolar transistor whose collector and base are coupled, which are provided in series between a power supply node to which the power supply voltage is supplied and a GND node, and
    a switch provided in parallel with one resistor of the plurality of resistors, and
    the switch is turned off in the first mode, and the switch is turned on in the second mode.

7. The circuit device according to claim 6, wherein
    $R1=(V1-V2)/IRF$ is satisfied, in which the reference current is set to IRF, the power supply voltage in the first mode is set to V1, the power supply voltage in the second mode is set to V2, and a resistance value of the resistor provided in parallel with the switch is set to R1.

8. The circuit device according to claim 5, wherein
the temperature sensor includes
a first bipolar transistor whose collector is supplied with a current obtained by mirroring the reference current,
a first resistor provided between a base and the collector of the first bipolar transistor, and
a second resistor provided between an emitter of the first bipolar transistor and a GND node and having a variable resistance value.

9. An oscillator configured to switching between a first mode in which phase noise of an output clock signal is lower than that in a second mode and the second mode in which power consumption is smaller than that in the first mode, the circuit device comprising:
a resonator; and
a circuit device, wherein
the circuit device includes
an oscillation circuit configured to oscillate the resonator to generate an oscillation signal;
an output circuit configured to output the output clock signal based on the oscillation signal;
a temperature sensor configured to output a temperature detection signal;
a temperature compensation circuit configured to perform temperature compensation on an oscillation frequency of the oscillation circuit based on the temperature detection signal; and
a control circuit configured to perform control such that a power supply voltage supplied to the oscillation circuit in the first mode is higher than a power supply voltage supplied to the oscillation circuit in the second mode, and perform control such that at least one of a reference voltage supplied to the temperature compensation circuit based on the power supply voltage and a reference current supplied to the temperature sensor based on the power supply voltage does not change between the first mode and the second mode.

* * * * *